United States Patent [19]

Fujii et al.

[11] Patent Number: 5,790,440
[45] Date of Patent: *Aug. 4, 1998

[54] APPARATUS FOR ESTIMATING FILTER COEFFICIENTS

[75] Inventors: Kensaku Fujii; Juro Ohga, both of Kawasaki, Japan

[73] Assignee: Fujitsu Limited, Kanagawa, Japan

[*] Notice: The term of this patent shall not extend beyond the expiration date of Pat. No. 5,638,311.

[21] Appl. No.: 567,632

[22] Filed: Dec. 5, 1995

[30] Foreign Application Priority Data

Mar. 10, 1995 [JP] Japan .................. 7-050836

[51] Int. Cl.$^6$ ............................................. G06F 17/10
[52] U.S. Cl. ................................................ 364/724.19
[58] Field of Search .................. 364/724.19, 724.2; 379/406; 381/95

[56] References Cited

U.S. PATENT DOCUMENTS

| | | | |
|---|---|---|---|
| 5,278,780 | 1/1994 | Eguchi | 364/724.19 |
| 5,329,472 | 7/1994 | Sugiyama | 364/724.19 |
| 5,475,632 | 12/1995 | Sugiyama | 364/724.19 |
| 5,553,014 | 9/1996 | DeLéon, II et al. | 364/724.19 |
| 5,563,817 | 10/1996 | Ziegler, Jr. et al. | 364/724.19 |
| 5,608,804 | 3/1997 | Hirano | 364/724.19 |
| 5,638,311 | 6/1997 | Fujii et al. | 364/724.19 |

OTHER PUBLICATIONS

Scott C. Dauglas, "A Family of Normalized LMS Algorithms," IEEE Signal Processing Letter, vol. 1, No. 3, pp. 49-51, Mar. 1994.

K Fujii et al., "A Study of the Availability of a 'Polarized-x' Algorithm," (in Japanese) Technical Report of IEICE, DSP95-27, pp. 31-38, May 1995.

K Fujii et al., "Individually Normalized' LMS Algorithm Suitable for Fixed Point Processing and Its Application to Active Noise Control," (in Japanese) Trans. IEICE, vol. J78-A No. 6, pp. 669-677, Jun. 1995.

K Fujii et al., A New Version of the NLMS Algorithm Suitable for Fixed Point Proceedings of the 4th International Workshop on Acoustic Echo and Noise Control, 21-23 Jun. 1995, Roros, Norway, pp. 75-78.

Primary Examiner—David H. Malzahn
Attorney, Agent, or Firm—Helfgott & Karas, P.C.

[57] ABSTRACT

An apparatus for estimating filter coefficients operates in a system which includes a filter simulating characteristics of an unknown signal transmission system based on a signal provided to the unknown signal transmission system and a response signal produced from the unknown signal transmission system. The apparatus includes an accumulation calculating section for accumulating a product of the signal provided to the unknown signal transmission system and a difference between the response signal from the unknown signal transmission system and an output signal of the filter for a given time period. The apparatus further includes a square-sum calculating section for accumulating a square of the signal provided to the unknown signal transmission system for the given time period. The apparatus also includes an adjusting-amounts simulating section for simulating coefficient adjusting amounts of the filter based on a ratio of an output of the accumulation calculating section to an output of the square-sum calculating section. In the apparatus, coefficients of the filter are adjusted by using the coefficient adjusting amounts simulated in the adjusting-amounts simulating section.

27 Claims, 34 Drawing Sheets

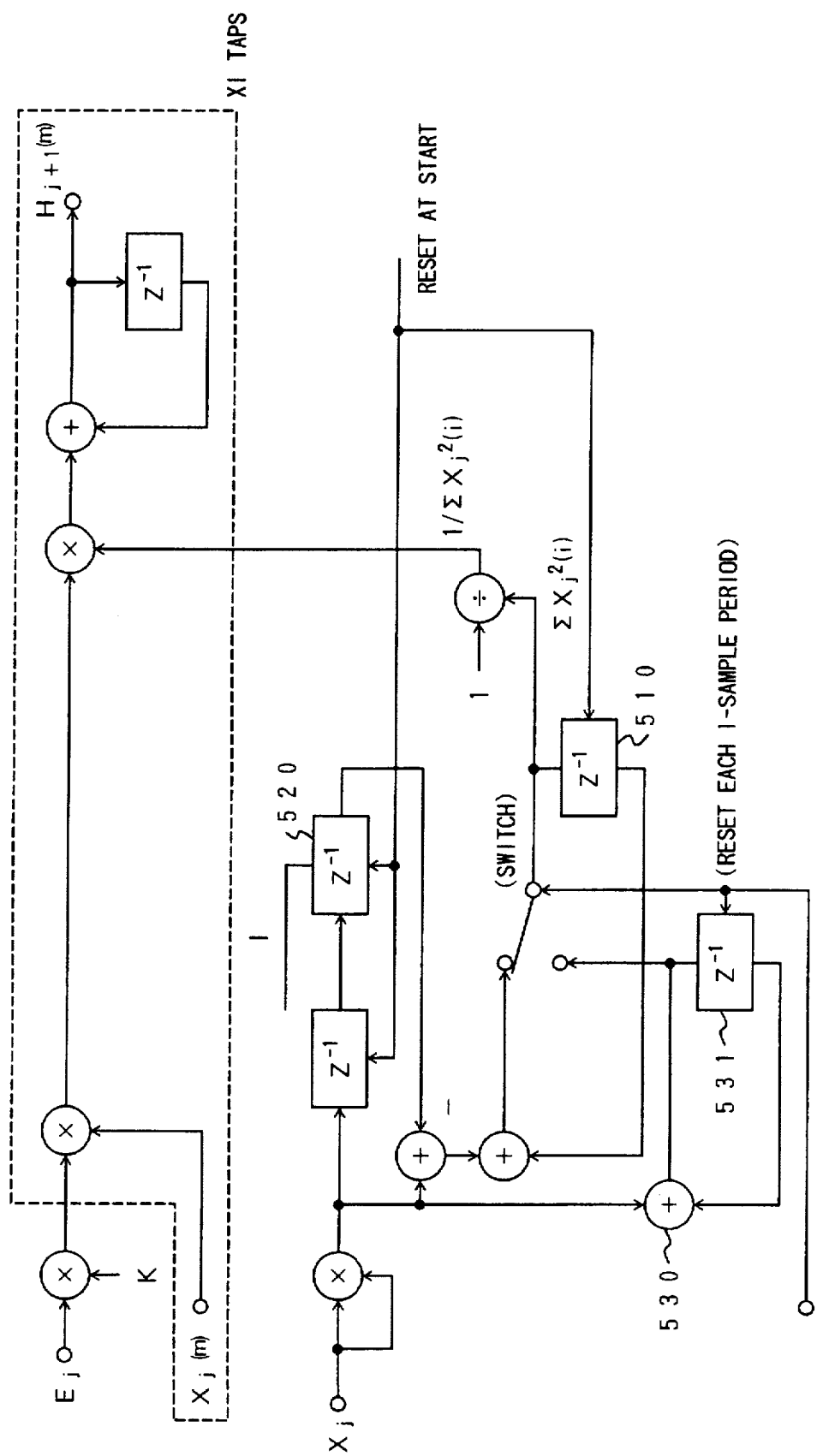
F I G. 13

FIG. 16

| | CONVENTIONAL NLMS | PRESENT INVENTION BASIC TYPE | PRESENT INVENTION MOVING-AVERAGE TYPE |
|---|---|---|---|
| COEFFICIENT ADJUSTMENT (ADDITION) | I | I *) | I |
| NORMALIZATION (DIVISION) | 1 | 1 *) | 1 |
| SQUARE OF $X_j$ | 1 | 1 | 1 |
| RIGHT-DIRECTION SHIFT OF SHIFT REGISTER STORING THE SQUARE | 1 | -- | -- |
| SUBTRACTION OF THE PREVIOUS SQUARE FROM THE LATEST SQUARE | 1 | -- | 1 |
| ACCUMULATION OF THE SQUARE | 1 | 1 | -- |
| ACCUMULATION OF THE SQUARE FOR NORMALIZING BY THE NORM | | -- | -- |
| CONTROL SIGNAL REQUIRED EVERY I SAMPLE TIMES | SWITCH | RESET | SET/RESET |
| INITIAL RESET | 1 | -- | -- |
| SHIFT REGISTER (I TAPS) | 1 | -- | -- |
| REGISTER | I+2 | 2I | 2I+2 |

*) CARRYING OUT EACH UNIT OF I SAMPLE TIMES

APPARATUS FOR ESTIMATING FILTER COEFFICIENTS

BACKGROUND OF THE INVENTION

1. Field of the Invention

The present invention generally relates to an apparatus for estimating filter coefficients, and more particularly, to an apparatus for estimating, by a reference signal provided to an unknown signal transmission system and a response from the unknown signal transmission system, adaptive finite impulse response (FIR) filter coefficients which indicate characteristics of the unknown signal transmission system.

2. Description of the Related Art

FIG. 1 shows a typical configuration of an apparatus for estimating filter coefficients which indicate characteristics of an unknown signal transmission system. The apparatus for estimating filter coefficients includes a finite impulse response (FIR) filter 210 and a coefficient adjusting circuit 220 having an adaptive algorithm.

In FIG. 1, a response $g_j$ of an unknown signal transmission system 200 is represented in the following equation.

$$g_j = \Sigma h_j(i) X_j(i) \tag{1}$$

where j: sample time index, iteration, $\Sigma$: addition for i=1 to I, $h_j(i)$: i'th sample of an impulse response of the unknown signal transmission system 200, $X_j(i)$: a delayed reference signal which is delayed from a reference signal $X_j$ by i samples, I: a maximum delay of the impulse response of the unknown signal transmission system 200.

To the response $g_j$ of the unknown signal transmission system 200, disturbance $N_j$ is added to produce $Y_j$.

$$Y_j = g_j + N_j \tag{2}$$

Meanwhile, the FIR filter 210 provides a suspected response $G_j$ which is represented by the following equation.

$$G_j = \Sigma H_j(i) X_j(i) \tag{3}$$

The coefficient adjusting circuit 220 updates a coefficient $H_j$ of the FIR filter 210 so that a difference $E_j$ between an output $Y_j$ of the adder 230 and the suspected response $G_j$ from the FIR filter 210 can be minimized. Operations of the FIR filter 210 and the coefficient adjusting circuit 220 are commonly realized by a digital signal processor (DSP).

In the coefficient adjusting circuit 220, a least-mean square (LMS) algorithm and a normalized least-mean square (NLMS) algorithm which is a modification of the LMS algorithm are commonly used.

Whether the algorithm is calculated with floating-point processing or fixed-point processing strongly influences processing speed and production cost. In general, a fixed-point processor may achieve a fast processing and may be less expensive. For this advantage, providing the fixed-point processor to the apparatus is desired. However, in the fixed-point processor, a convergence property may be degraded due to a word length limit, and a dynamic range of the reference signal is less as compared to the floating-point processor. Therefore, there is a problem that application of the fixed-point processing is limited.

In the following, descriptions will be given of these problems in further detail.

(1) NLMS Algorithm Provided by Fixed-Point Processing

When the above-described apparatus for estimating the filter coefficients is applied to an echo canceller, an active noise control device, etc., an adaptive algorithm used in the apparatus needs to realize characteristics of high-speed convergence, stability, and a small amount of processing. Also, for commercial use, the apparatus in which the adaptive algorithm is installed needs to be less expensive.

FIG. 2 shows a configuration of hands-free communication equipment having an apparatus for estimating filter coefficients. In the hands-free communication equipment, for users to be able to communicate with each other in a hands-free condition, an acoustic echo canceller 200 which reduces acoustic coupling between a speaker 201 and a microphone 202 is provided. The equipment comprises the acoustic echo canceller 200 and a signal transmission system 100. The signal transmission system 100 includes the speaker 201 producing a far-end talker's signal, and the microphone 202 provided with a near-end talker's signal. The acoustic echo canceller 200 includes an adaptive filter 220 simulating the signal transmission system, a subtracter 210 eliminating an echo from the speaker 201 to the microphone 202, and a coefficient adjusting circuit 230 updating coefficients of the adaptive filter 220, etc.

In FIG. 2, the echo is a response $g_j$ of the signal transmission system 100, which is represented by the following equation, as in the equation (1).

$$g_j = \Sigma h_j(i) X_j(i) \tag{4}$$

where $h_j(i)$ is the i'th sample of an impulse response $h_j$ at time j of the signal transmission system 100 (echo path) from the speaker 201 to the microphone 202, $X_j(i)$ is the i'th sample of a far-end talker's signal $X_j$ at time j to be an echo, and I is a maximum delay of the echo of the signal transmission system 100.

In the echo canceller 200, an echo replica $G_j$ is synthesized in the adaptive FIR filter 220 as follows:

$$G_j = \Sigma H_j(i) X_j(i), \tag{5}$$

where $H_j(i)$ is the i'th sample of an adaptive filter coefficient at time j. And, the response $g_j$ is cancelled by the echo replica $G_j$ in the subtracter 210. In the above operation, it is assumed that the number of taps of the adaptive filter 220 is the same as the maximum delay I of the echo.

In the echo canceller 200, performance of cancelling an echo is measured by a difference $\delta_j(i)$ between the adaptive filter coefficient $H_j(i)$ calculated by the coefficient adjusting circuit 230 and the impulse response $h_j(i)$ of the signal transmission system 100.

$$\delta_j(i) = h_j(i) - H_j(i) \tag{6}$$

An effect of the acoustic echo canceller 200 becomes maximum when the following error $E_j$ (remaining echo) is minimum.

$$E_j = \Sigma \delta_j(i) X_j(i) + N_j \tag{7}$$

where $N_j$ is outside noise.

In the configuration example shown in FIG. 2, the coefficient adjusting circuit 230 adjusts the filter coefficient $H_j(i)$ of the adaptive filter 220 so as to minimize the above error $E_j$, and determines the filter having the impulse response representing the characteristics of the signal transmission system 100.

FIG. 3 shows a configuration of an active noise control device having an apparatus for estimating filter coefficients.

In the active noise control device, noise generated in a fan 305 is cancelled in a duct 300. The active noise control device comprises a noise detecting microphone 302 detecting noise, a noise control filter 320 generating a noise replica, a speaker 303 outputting the noise replica, an error detecting microphone 304 detecting a residual noise error, a feedback control filter 310 simulating a feedback system, a coefficient adjusting circuit 340 updating coefficients of the noise control filter 320, and an error path filter 330 simulating a path from the noise control filter 320 to the coefficient adjusting circuit 340 through the error detecting microphone 304.

In the active noise control device, the speaker 303 outputs the noise replica which has the same amplitude and the opposite phase as those of noise flowing through the duct 300 at a position of the error detecting microphone 304. The noise flowing through the duct 300 is cancelled by the noise replica at the position of the error detecting microphone 304 to suppress the noise flowing out of the duct 300. In this description, it is assumed that a part of the noise replica transmitted from the speaker 303 to the noise detecting microphone 302 is completely cancelled by an output of the feedback control filter 310. This path from the speaker 303 to the noise detecting microphone 302 is not directly related to an effect of the present invention.

In the active noise control device, the unknown signal transmission system shown in FIG. 1 corresponds to a noise transmission path from the noise detecting microphone 302 to the error detecting microphone 304. The reference signal provided to the unknown signal transmission system shown in FIG. 1 corresponds to the fan noise $X_j$ detected by the noise detecting microphone 302. The filter simulating the characteristics of the unknown signal transmission system shown in FIG. 1 corresponds to the noise control filter 320. And, the coefficient adjusting circuit 340 corresponds to the apparatus for estimating filter coefficients.

In the active noise control device, the coefficient adjusting circuit 340 adjusts the coefficients $H_j$ of the noise control filter 320 so as to minimize an output $e_j$ of the error detecting microphone 304. At this time, the noise radiating from an exit of the duct 300 is minimized.

A method of constructing the coefficient adjusting circuit 340 for calculating the filter coefficients $H_j$ will now be described. When the coefficient adjusting circuit 340 is practically used, the following points become important: 1) a calculation result not over a calculation word length limit, 2) a guaranteed stable circuit operation, 3) minimal processing, and 4) high-speed convergence.

In a conventional apparatus, as an algorithm for estimating the filter coefficients which simulate the characteristics of the unknown signal transmission system by using the reference signal provided to the system and the response produced from the system, the least-mean square (LMS) algorithm is typically used. The LMS algorithm is represented by the following equation.

$$H_{j+1}(m) = H_j(m) + \mu E_j X_j(m) \qquad (8)$$

where m is a tap number of an adaptive filter, and $\mu$ is a step gain whose range is defined as a function of power of a signal $X_j$ provided to the unknown signal transmission system. For example, when the power of the signal $X_j$ is high, an upper limit of $\mu$ with which a stable update of the coefficients is achieved is low, while, when the power thereof is low, the upper limit of $\mu$ is high. Therefore, in practical use, the step gain is commonly set to a fixed value which is less than the upper limit determined by an estimated maximum power of the signal $X_j$.

On the other hand, it is known that the convergence speed becomes fast as the step gain becomes large. Therefore, when the step gain is set according to the maximum power of the signal $X_j$, the convergence speed becomes slow in a time period of a low power. Unfortunately, the time period of the low power is longer than that of the maximum power. As a result, an overall convergence speed becomes slow.

The above problem is resolved by the normalized least-mean square (NLMS) algorithm. In the NLMS algorithm, as shown in the following equation, the second term of the above equation (8) is normalized by the norm $[\Sigma X_j^2(i)]$ of the signal provided to the unknown signal transmission system.

$$H_{j+1}(m) = H_j(m) + K E_j X_j(m)/\Sigma X_j^2(i) \qquad (9)$$

The NLMS algorithm is well known as an algorithm suitable for an apparatus such as the acoustic echo canceller 200 shown in FIG. 2 in which a voice having a largely fluctuating amplitude is provided to the unknown signal transmission system.

As mentioned above, suitability of the adaptive algorithm for the acoustic echo canceller and the active noise control device is determined based on the convergence speed, operation stability, and processing amounts, etc. At present, the most suitable algorithm satisfying all the above requirements is supposed to be the NLMS algorithm. Therefore, the NLMS algorithm is currently being modified to improve performance, more specifically, to improve the convergence property.

Furthermore, for commercial use, cost of the apparatus provided with the adaptive algorithm needs to be lower. One method of meeting the above requirement is to design the NLMS algorithm with fixed-point processing. The fixed-point processing enables an employment of a low-price signal processor and improves processing speed. By the improvement of the processing speed, for example, the noise controlling duct in the active noise control device may be extremely miniaturized, and, thus, cost of producing the device may be reduced.

However, when the fixed-point processing is used, there is a problem in that the adaptive filter coefficients cannot be properly adjusted when adjusting amounts to be added to the coefficients are less than the minimum expressed by the word length. This is due to the fact that, in the NLMS algorithm, the adjusting amounts of the coefficients are suppressed to less than one divided by the number of taps (x K, when the step gain K is less than 1) by the normalization with the norm. Namely, in the equation (9), the norm $[\Sigma X_j^2(i)]$ becomes large in proportion to the number of taps I, and the numerator $E_j X_j(m)$ in the equation (9) becomes small according to the procedure of the coefficients adjustment. The above problem depends on the above behavior in the equation (9). When the filter coefficients $H_j$ are calculated with the fixed-point processing to apply the low-price processor or to improve the calculation speed (which indicates reduction of the number of processors), the second term of the equation (9) may be less than the minimum expressed by the word length due to a large denominator and a small numerator. Therefore, the coefficient adjustment may be invalid.

In this case, when the adjusting amounts are less than the minimum expressed by the word length, the adaptive filter coefficients may not be adjusted. A probability of occurrence of that case is high, when the number of taps of the adaptive filter is large or when the step gain needs to be set small due to large outside noise. As the probability is high, the convergence speed becomes slow. In addition, when the coefficient adjustment is repeatedly carried out and the error is reduced, the adjusting amounts may be too small to be expressed by the number of figures of the fixed-point processing, and, thus, it becomes impossible to adjust the coefficients. As a result, improving an estimation accuracy may be limited.

In the following, the above problems, which occurs when the estimation of the adaptive filter coefficients by using the NLMS algorithm is carried out with the fixed-point processing, will be discussed in further detail according to the equation (9). In the equation (9), the error occurring when the equation (9) is calculated with the fixed-point processing is divided into two error components related to the first and second terms. The error component related to the first term $H_j(m)$ is equivalent to a component less than the word length limit, the component being omitted when the impulse response $h_j(i)$ [i=1 to I] of the echo path is expressed with the fixed-point processing. In this case, a gain of an amplifier associated with the far-end talker's signal $X_j$ and the microphone output $Y_j$ is properly adjusted, and levels of the far-end talker's signal $X_j$ and the microphone output $Y_j$ are adjusted for each other so that the adaptive filter coefficients $H_j(m)$ could be sufficiently large in the given word length.

$$Y_j = g_j + S_j + N_j, \quad (10)$$

where $S_j$ is a near-end talker's signal. As a result, the error may be suppressed. When the levels are properly adjusted, deterioration in precision due to the fixed-point processing of the adaptive filter coefficients $H_j(m)$ may be substantially prevented.

A problem also occurs in the second term of the equation (9). To clarify an influence of the fixed-point processing on the estimation error, from the echo $g_j$ in the equation (4) and the echo replica $G_j$ in the equation (5), the residual echo $E_j$ in the equation (4) is derived. Next, from the residual echo $E_j$, a component in the m'th tap is separated, and the numerator of the second term in the equation (9) is rearranged as follows:

$$E_j X_j(m) = [h_j(m) - H_j(m)] X_j^2(m) + [\Sigma_m \delta_j(i) X_j(i) + N_j] X_j(m) \quad (11)$$

where $\Sigma_m$ is an adding operation for i=1 to I except for i=m. It is evident that desired adjusting amounts $\delta_j(m)$ for the m'th tap coefficient of the adaptive filter is given by a difference between the impulse response $h_j(m)$ and the adaptive filter coefficients $H_j(m)$ as follows:

$$\delta_j(m) = h_j(m) - H_j(m) \quad (12)$$

However, in the NLMS algorithm, when $E_j X_j(m)$ in the above equation (11) is substituted into the equation (9), a problematic component, $$D_j(m) = \delta_j(m) K X_j^2(m) / \Sigma X_j^2(i), \quad (13)$$

is obtained as a coefficient adjusting amount. When the coefficient adjusting amount $D_j(m)$ satisfies the following equation for the minimum value $2^{-M}$ expressed by the fixed-point processing, $$D_j(m) < 2^{-M}, \quad (14)$$

it is easily understood that the coefficient adjustment may not be carried out. The equation (14) shows that as the step gain K is small and the number of taps of the adaptive filter is large, the coefficient adjusting amount $D_j(m)$ frequently becomes less than the minimum expressed by the word length of the fixed-point processing. In this case, the convergence speed becomes slow. Further, if only a large estimation error $D_j(m)$ is used for the adjustment with the limitation of the equation (14), estimating precision may not be improved.

FIG. 4 shows a graphical illustration for explaining an influence of the fixed-point processing on the convergence property. FIG. 4 shows a convergence condition when the equation (9) is wholly calculated with floating point processing. And also, FIG. 4 shows convergence conditions when the second term of the equation (9) is calculated with the floating point processing and is converted to a form in the 16-bit fixed-point processing to be added to the coefficients $H_j(m)$. In both calculations, conversion between an analog signal and a digital signal is carried out with 16-bit linear processing. The number of taps of the adaptive filter is 512, the step gain K of 0.01, 0.05, 0.025 is used, and a power ratio of the echo to the outside noise is 10 dB. Transition from the floating point processing to the fixed-point processing is carried out by omitting any component under the minimum expressed by the word length.

From FIG. 4, even if a simple operation that the second term is calculated with the floating-point processing and is converted to the form in the fixed-point processing is applied, such coefficient adjustment by using the NLMS algorithm with the fixed-point processing may delay the convergence and may degrade the estimating precision. And, from FIG. 4, it has been shown that a small step gain may have the opposite effect of reducing the echo suppression.

In the same way, these problems may also be caused in a filtered-X LMS algorithm represented by the following equation which is used in the active noise control device shown in FIG. 3.

$$H_{j+1}(m) = H_j(m) + \mu e_j Y_j(m) \quad (15)$$

where $Y_j$ is an output of the error path filter 330, and $e_j$ is the output of the microphone 304.

Further, theses problems may also be caused in a filtered-X NLMS algorithm represented by the following equation which is normalized by norm $\Sigma Y_j^2(i)$ of the output of the error path filter 330.

$$H_{j+1}(m) = H_j(m) + K \, e_j Y_j(m) / \Sigma Y_j^2(i) \quad (16)$$

The above-described normalization by the norm constructs a principle of the NLMS algorithm. Therefore, it is difficult to resolve a problem occurring based on the principle by only a scaling operation. Accordingly, it is desired that the problem is resolved by improving the adaptive algorithm itself.

(2) Dynamic range of Reference Signal

As mentioned above, in the NLMS algorithm, the following equation is determined for the adjustment of the m'th tap coefficient in the FIR filter 210 at time j+1.

$$H_{j+1}(m) = H_j(m) + K \, E_j X_j(m) / \Sigma X_j^2(i) \quad (17)$$

where K is the step gain (0<K<2), and $\Sigma$ is an adding operation for i=1 to I (I is the number of taps of the FIR filter). The word length of the fixed-point processor is typically 16 bits for the calculation of the second term of the equation (17). However, the word length of the product $E_j X_j(m)$ and the square $X_j^2(i)$ is extended to 32 bits. Therefore, when the following calculation is also carried out with the 16-bit fixed-point processing, the lower 16 bits are omitted. This means that a small amplitude reference signal $X_j$ or a small error reduced by the coefficient adjustment is dropped to zero. Therefore, it becomes difficult to maintain the coefficient adjustment. Accordingly, the dynamic range of the reference signal $X_j$ provided to the system may decrease, and, thus, high estimating precision may not be obtained.

The problem of extension of the word length may be resolved by a sign algorithm. A coefficient adjusting equation with the LMS algorithm is represented as follows:

$$H_{j+1}(m)=H_j(m)+K\ E_j X_j(m) \tag{18}$$

A equation of the sign algorithm is obtained by replacing the error component $E_j$ in the second term of the equation (18) by ± sign.

$$H_{j+1}(m)=H_j(m)+K\ X_j(m)\ sgn[E_j] \tag{19}$$

where a function sgn[ ] indicates + sign or − sign of a variable within the symbol [ ]. In the equation (19), the product $X_j(m)\ sgn[E_j]$ in the second term may positively maintain the word length of the reference signal $X_j$. Namely, in the sign algorithm, for the small-amplitude reference signal, the lower bits may not be omitted, and, thus, the coefficient adjustment may be maintained.

However, there is also a problem in the sign algorithm as described in the following. In the equation (19), the error component $E_j$ is represented by the following equation.

$$E_j=\{h_j(m)-H_j(m)\}X_j(m)+\Sigma_m[h_j(i)-H_j(i)]X_j(i)+N_j \tag{20}$$

where $\Sigma_m$ is an adding operation for i=1 to I except for i=m. In the sign algorithm, the error component $E_j$ is converted to the ± sign by the function sgn[$E_j$], whereby, the estimating error [$h_j(i)-H_j(i)$] required for adjusting the m'th tap coefficient may not be correctly derived. This occurs because the first term and the second term in the equation (20) are not separated from each other when the function sgn[$E_j$] is used.

FIG. 5 shows characteristics of response cancellation in the sign algorithm when the step gain K is 0.000263. In FIG. 5, characteristics of the LMS algorithm are also shown. The response cancellation is a short-time-period integration of $(g_j-G_j)^2/g_j^2$. These algorithms are wholly calculated with the floating-point processing. In the calculation, the number I of taps of the FIR filter 210 is 512, the power ratio of the reference signal to the outside noise is 10 dB, the step gain K of the LMS algorithm is 0.0022, and the step gain K of the sign algorithm is 0.000263. FIG. 6 shows characteristics of response cancellation in the sign algorithm when the step gain K is 0.000132. As indicated in these drawings, the sign algorithm degrades characteristics of the response cancellation, as compared to the LMS algorithm.

SUMMARY OF THE INVENTION

It is an object of the present invention to provide an apparatus for estimating filter coefficients. In the apparatus, even if a word length is limited, adaptive filter coefficients may be properly adjusted without invalidating coefficient adjustment.

Furthermore, in the apparatus, when a floating-point processor is used, a processing time is reduced by increasing fixed-point processing. When a fixed-point processor is used, even if a dynamic range of an algorithm used in the apparatus is small, coefficient adjustment may be properly performed.

This permits the disadvantages described above to be eliminated.

The object described above is achieved by an apparatus for estimating filter coefficients in a system which includes a filter simulating characteristics of an unknown signal transmission system based on a signal provided to the unknown signal transmission system and a response signal produced from the unknown signal transmission system, the apparatus comprising: an accumulation calculating section for accumulating a product of the signal provided to the unknown signal transmission system and a difference between the response signal from the unknown signal transmission system and an output signal of the filter for a given time period; a square-sum calculating section for accumulating a square of the signal provided to the unknown signal transmission system for the given time period; and an adjusting-amounts simulating section for simulating coefficient adjusting amounts of the filter based on a ratio of an output of the accumulation calculating section to an output of the square-sum calculating section; wherein coefficients of the filter are adjusted by using the coefficient adjusting amounts simulated in the adjusting-amounts simulating section.

The object described above is also achieved by the apparatus mentioned above, wherein the square-sum calculating section comprises a shift register successively storing the square of the signal provided to the unknown signal transmission system, the square-sum calculating section accumulating an output of each tap of the shift register to obtain an accumulation of the square of the signal, the accumulation being used for simulating the coefficient of each tap of the filter.

According to the above apparatus for estimating filter coefficients according to the present invention, the coefficients are estimated based on coefficient adjusting amounts which are a difference between an impulse response of the unknown system and its estimated value. The difference may not be overly reduced unlike the case of using the NLMS algorithm. When the difference is directly summed as the coefficient adjusting amounts, even if fixed-point processing is used, an effective figure number of the coefficient adjusting amounts is the same as that of an adaptive filter coefficient. Therefore, there is no problem that deterioration in precision is caused due to omission of the lower figures.

Namely, in the present invention, the product of a response error signal (difference between the response from the unknown system and the output of the filter) and the signal provided to the unknown system is integrated for the given time period. And, the square of the signal provided to the unknown system is also integrated for the given time period. Then, the above-mentioned difference between the impulse response and the estimated value is simulated based on the ratio of the above two integrated values. In the calculation, a term in the equation which may cause an estimating error of the coefficient adjustment is suppressed to one divided by the number of integrating terms by an averaging effect of the integration for the given time period. Further, since from the term corresponding to the coefficient adjusting amounts, division by the square-sum is eliminated as compared to the NLMS algorithm, the effective figure number related to the division is not reduced. Therefore, the coefficient adjustment may be maintained without being stopped by the extreme reduction of the coefficient adjusting amounts.

The object described above is also achieved by an apparatus for estimating filter coefficients in a system which includes an adaptive filter simulating characteristics of an unknown signal transmission system based on a reference signal provided to the unknown signal transmission system and a response signal produced from the unknown signal transmission system, the apparatus comprising: a first error information deriving section for deriving information related to an error between an impulse response of the unknown signal transmission system and coefficients of the adaptive filter based on a ratio of a result of integrating, for a given time period, a product of a difference between the response of the unknown signal transmission system and an output of the adaptive filter and a sign of the reference signal to an integration value of absolute values of the reference signal for the given time period; and a first coefficient adjusting section for adjusting the coefficients of the adaptive filter based on the information from the first error information deriving section; wherein the number of coefficients adjusted for one sample time is restricted, and the number of the integration values of the absolute values of the reference signal used for obtaining the ratio is restricted to less than a number of taps of the adaptive filter.

The object described above is also achieved by an apparatus for estimating filter coefficients in a system which includes an adaptive filter simulating characteristics of an unknown signal transmission system based on a reference signal provided to the unknown signal transmission system and a response signal produced from the unknown signal transmission system, the apparatus comprising: a second error information deriving section for deriving information related to an error between an impulse response of the unknown signal transmission system and coefficients of the adaptive filter based on a ratio of a product of a difference between the response of the unknown signal transmission system and an output of the adaptive filter and a sign of the reference signal to a sum of absolute values of taps of the adaptive filter; and a second coefficient adjusting section for adjusting the coefficients of the adaptive filter based on the information from the second error information deriving section.

The object described above is also achieved by an apparatus for estimating filter coefficients in a system which includes an adaptive filter simulating characteristics of an unknown signal transmission system based on a reference signal provided to the unknown signal transmission system and a response signal produced from the unknown signal transmission system, and in the system, a difference between a response of the unknown signal transmission system and an output of the adaptive filter is transmitted through a second signal transmission path, a filter simulating a response of the second signal transmission path being provided, wherein a response of the filter is used as a second reference signal, the apparatus comprising: a fourth error information deriving section for deriving information related to an error between an impulse response of the unknown signal transmission system and coefficients of the adaptive filter based on a product of the response of the second signal transmission path and a sign of the second reference signal; and a fourth coefficient adjusting section for adjusting the coefficients of the adaptive filter based on the information from the fourth error information deriving section.

The object described above is also achieved by an apparatus for estimating filter coefficients in a system which includes an adaptive filter simulating characteristics of an unknown signal transmission system based on a reference signal provided to the unknown signal transmission system and a response signal produced from the unknown signal transmission system, and in the system, a difference between a response of the unknown signal transmission system and an output of the adaptive filter is transmitted through a second signal transmission path, a filter simulating a response of the second signal transmission path being provided, wherein a response of the filter is used as a second reference signal, the apparatus comprising: a fifth error information deriving section for deriving information related to an error between an impulse response of the unknown signal transmission system and coefficients of the adaptive filter based on a ratio of a result of integrating, for a given time period, a product of the response of the second signal transmission path and a sign of the second reference signal to a result of integrating, for the given time period, absolute values of the second reference signal; and a fifth coefficient adjusting section for adjusting the coefficients of the adaptive filter based on the information from the fifth error information deriving section.

According to the above apparatus, the word length is not extended due to the multiplication with the reference signal and the squaring. Therefore, even if an amplitude of the reference signal varies widely, the coefficients of the adaptive filter may be easily adjusted for such a reference signal. Further, the apparatus according to the present invention may be applied to a variety of adaptive algorithms.

Other objects and further features of the present invention will be apparent from the following detailed description when read in conjunction with the accompanying drawings.

BRIEF DESCRIPTION OF THE DRAWINGS

FIG. 13 shows a schematic diagram of the coefficient adjusting circuit according to the conventional NLMS algorithm;

FIG. 16 shows a comparison of the processing amounts of the conventional NLMS algorithm, and the algorithms according to the present invention;

DESCRIPTION OF THE PREFERRED EMBODIMENTS

Descriptions will be given of two types of apparatuses for estimating filter coefficients according to the present invention.

A. A first type of apparatus

Figure 7:
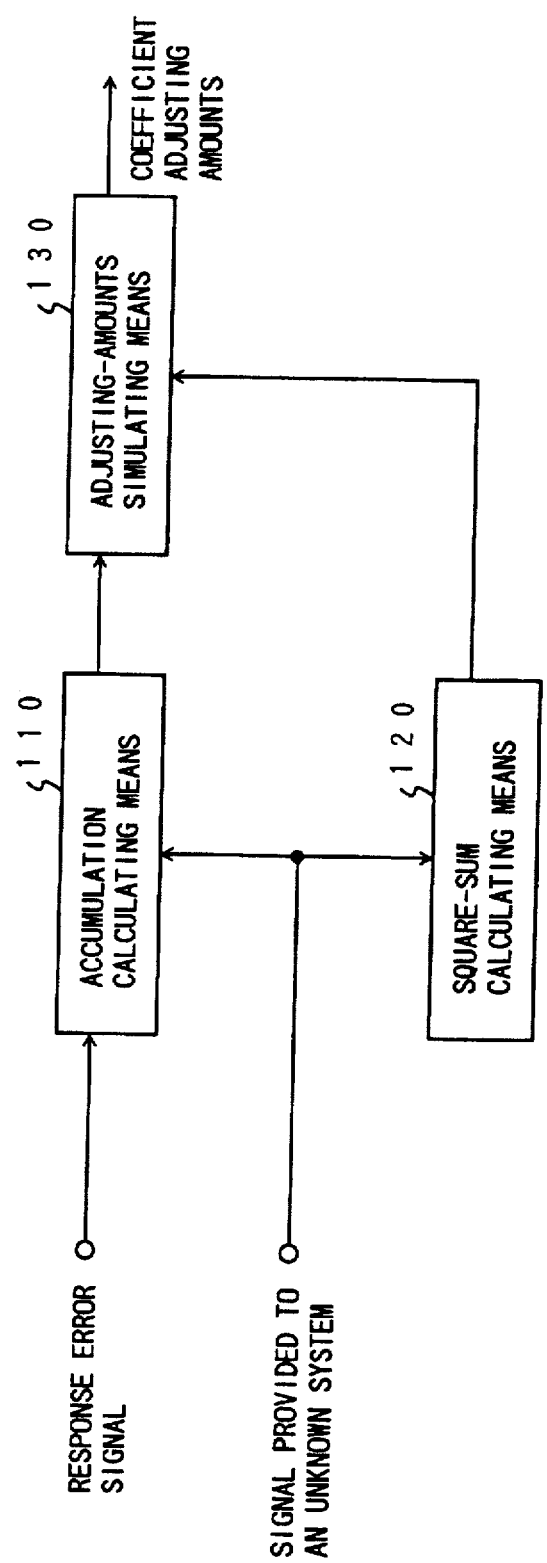
FIG. 7 shows a block diagram for explaining a principle of a first type of apparatus for estimating filter coefficients according to the present invention.

First, a description will be given of a principle of the first type of apparatus for estimating filter coefficients according to the present invention. FIG. 7 shows a block diagram for explaining the principle of the apparatus for estimating filter coefficients according to the present invention. The apparatus for estimating filter coefficients estimates response characteristics of an unknown signal transmission system (unknown system) based on a signal provided to the unknown system and a response signal produced from the unknown system. And, the apparatus estimates filter coefficients of a filter which produces a simulated response signal equivalent to the response signal produced from the unknown system.

The apparatus comprises accumulation calculating means 110, square-sum calculating means 120, and adjusting-amounts simulating means 130. The accumulation calculating means 110 accumulates a product of the signal provided to the unknown system and a difference (response error signal) between the response signal from the unknown system and the output of the filter for a given time period. The square-sum calculating means 120 accumulates the square of the signal provided to the unknown system for the given time period. The adjusting-amounts simulating means 130 calculates coefficient adjusting amounts of the filter based on a ratio of an output of the accumulation calculating means 110 to an output of the square-sum calculating means 120. And, by using the coefficient adjusting amounts simulated in the adjusting-amounts simulating means 130, the filter coefficients are adjusted.

In the apparatus for estimating filter coefficients according to the present invention, the filter coefficients are estimated using the coefficient adjusting amounts which are a difference between an impulse response of the unknown system and its estimated value. In this case, the difference is not likely to become extremely small as opposed to the case of using the NLMS algorithm. When the difference is directly summed as the coefficient adjusting amounts, even if fixed-point processing is used, an effective figure number of the coefficient adjusting amounts is the same as that of adaptive filter coefficients. Therefore, there is no problem that deterioration in precision is caused due to omission of the lower figures.

In the present invention, the product of the response error signal (difference between the response from the unknown system and the output of the filter) and the signal provided to the unknown system is integrated for the given time period. And, the square of the signal provided to the unknown system is also integrated for the given time period. Then, the above-mentioned difference between the impulse response and the estimated value is simulated based on the ratio of the above two integrated values. In the calculation of the coefficient adjusting amounts, a term in a corresponding equation which may cause an estimating error in the coefficient adjustment is suppressed to one divided by the number of integrating terms by averaging effect of the integration for the given time period. Further, since in the term corresponding to the coefficient adjusting amounts, division by the square-sum is eliminated as compared to the NLMS algorithm, the effective figure number related to the division is not reduced. Therefore, the coefficient adjustment may be maintained without being stopped by an extreme reduction of the coefficient adjusting amounts.

Figure 2:
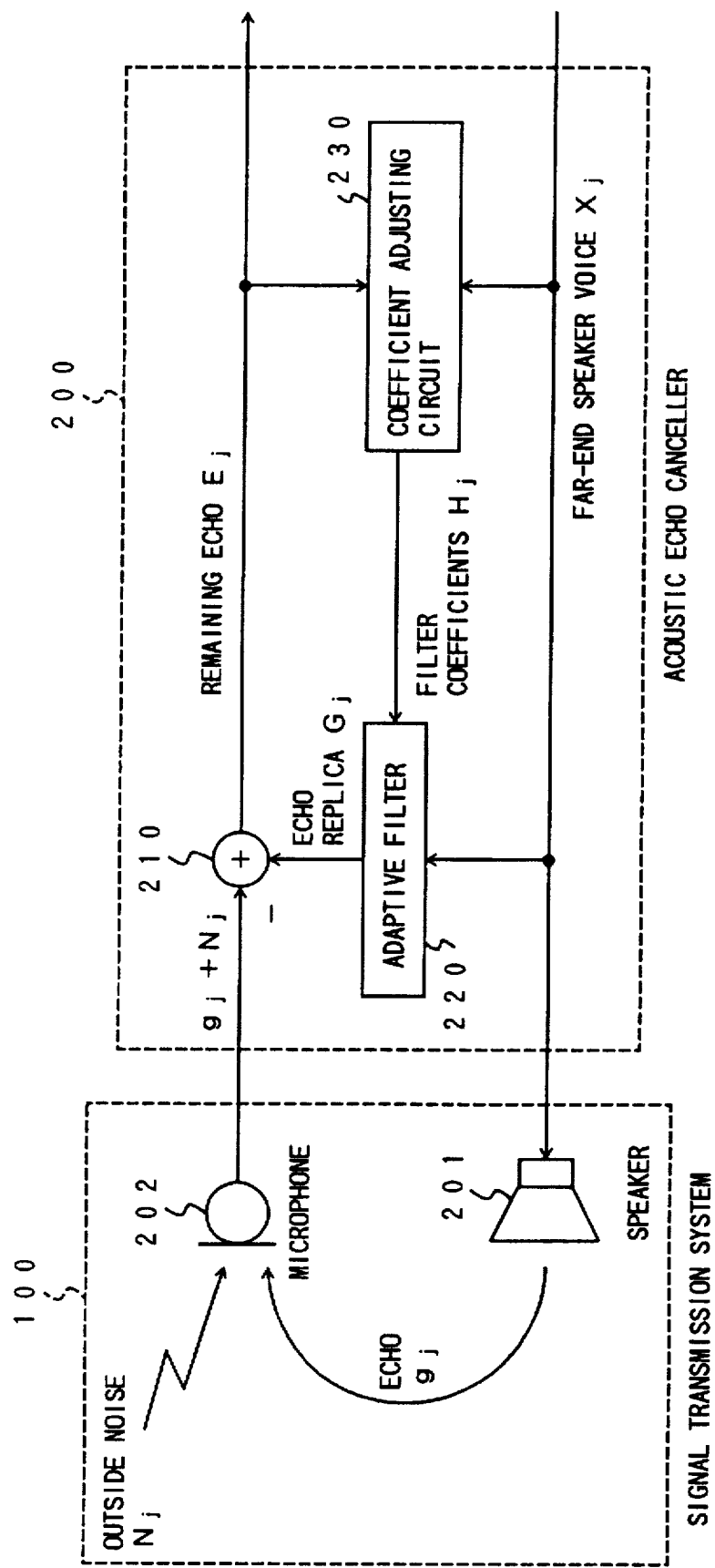
FIG. 2 shows a configuration of hands-free communication equipment using an apparatus for estimating filter coefficients.
Figure 8:
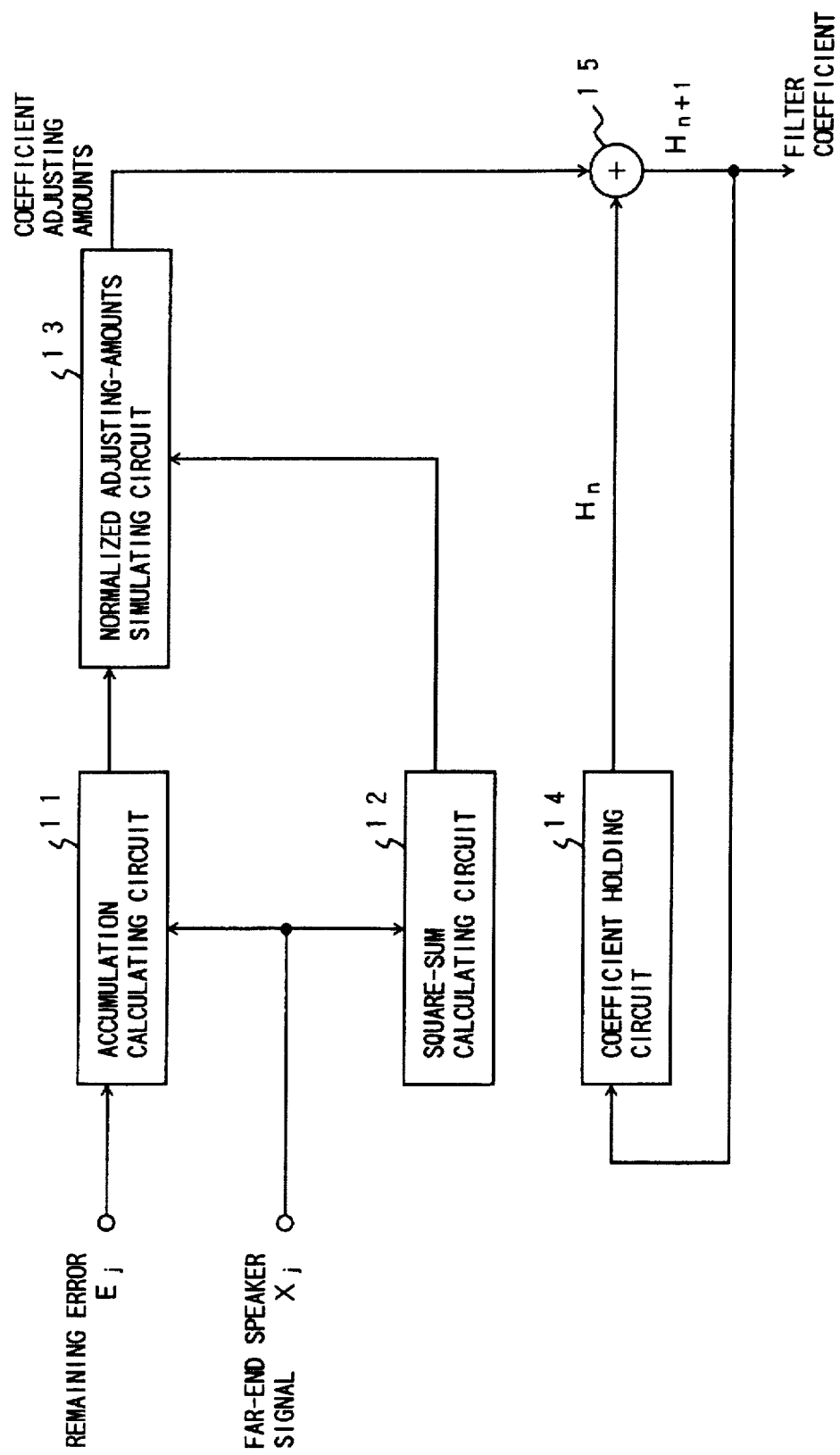
FIG. 8 shows a block diagram of the first type of apparatus for estimating filter coefficients according to the present invention.

Next, a description will be given of a first embodiment of the apparatus for estimating filter coefficients according to the present invention. FIG. 8 shows a block diagram of the apparatus for estimating filter coefficients according to the present invention. This embodiment is the acoustic echo canceller 200 of the hands-free communication equipment shown in FIG. 2 to which the present invention is applied. In the acoustic echo canceller 200, the apparatus according to the present invention is used as the coefficient adjusting circuit 230. Therefore, in the embodiment shown in FIG. 8, the far-end talker's signal $X_j$ from the line side and the remaining echo $E_j$ from the subtracter 210 shown in FIG. 2 are provided as input signals to the apparatus, and the adjusted coefficient $H_{n+1}$ is produced to the adaptive filter 220 of the echo canceller 200.

In FIG. 8, $E_j$ is the remaining echo from the subtracter 210, which is the difference between the echo $g_j$ from the unknown system and the echo replica $G_j$ synthesized in the adaptive filter 220. The apparatus shown in FIG. 8 comprises an accumulation calculating circuit 11, a square-sum calculating circuit 12, a normalized adjusting-amounts simulating circuit 13, a coefficient holding circuit 14, and an adder 15. The accumulation calculating circuit 11 accumulates a product of the remaining echo $E_j$ and the far-end talker's signal $X_j$ provided to the unknown system for the given time period. The square-sum calculating circuit 12 accumulates a square of the far-end talker's signal $X_j$ provided to the unknown system for the give time period. The normalized adjusting-amounts simulating circuit 13 simulates the coefficient adjusting amounts based on a ratio of the outputs of both circuits 11, 12. The coefficient holding circuit 14 holds the previously adjusted filter coefficient $H_n$. The adder 15 adds the coefficient adjusting amounts to the previously adjusted filter coefficient $H_n$ to produce a currently adjusted filter coefficient $H_{n+1}$.

In the following, an operation of the first embodiment will be discussed.

First, a procedure of adjusting the coefficients in the NLMS algorithm is modified as follows. The coefficient adjustment is carried out every J samples. The product $E_j X_j(m)$ and the square $X_j^2(m)$ related to the m'th tap of the adaptive filter are integrated for J samples, respectively, to produce $A_n(m)$ and $P_n(m)$ in an n block.

$$A_n(m) = \Sigma^* E_j X_j(m) \tag{21}$$

$$P_n(m) = \Sigma^* X_j^2(m) \tag{22}$$

where $\Sigma^*$ is an adding operation for j=nJ+1 to (n+1)J.

Therefore, adaptive filter coefficient $H_n(m)$ is adjusted according to the following equation to produce the adjusted coefficient $H_{n+1}(m)$.

$$H_{n+1}(m) = H_n(m) + K A_n(m)/P_n(m), \tag{23}$$

where n is the number of coefficient adjustments which have been performed every J samples from the start (namely, a block number).

Figure 9:
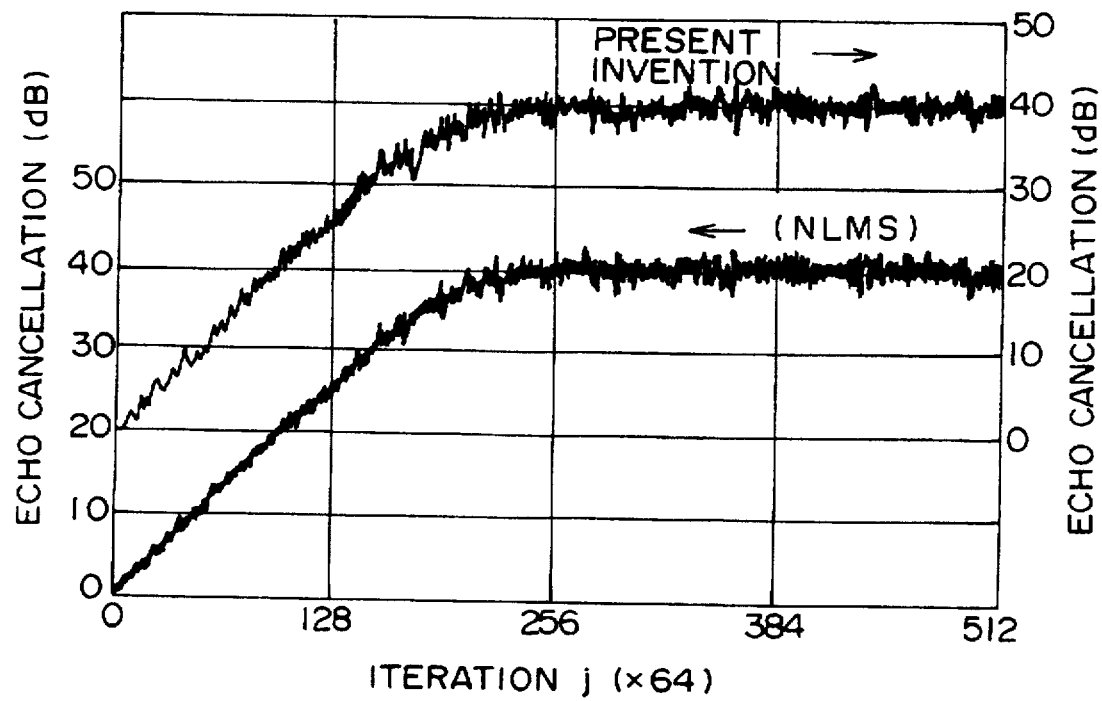
FIG. 9 shows a graphical representation of a convergence property of the apparatus for estimating filter coefficients according to the present invention.

FIG. 9 shows a graphical representation of a convergence property of the apparatus for estimating filter coefficients according to the present invention. In the calculation of FIG. 9, it is assumed that the adjusting period J is set to the number I of taps of the adaptive filter. In FIG. 9, the convergence property with the conventional NLMS algorithm which is wholly calculated by the floating-point processing is also shown. Since both convergence properties are almost the same, the illustrations are shifted from each other by 20 dB to clarify each convergence property. The convergence property according to the present invention may be substantially an ideal property. In the calculation of the FIG. 9, the number of taps of the adaptive filter and a time interval of the impulse response of the echo path is defined to 512, the step gain K is 0.2, and the power ratio of the echo to the outside noise is assumed to be 30 dB. The amount of echo cancellation is represented by averaging the values obtained for 64 samples.

Figure 10:
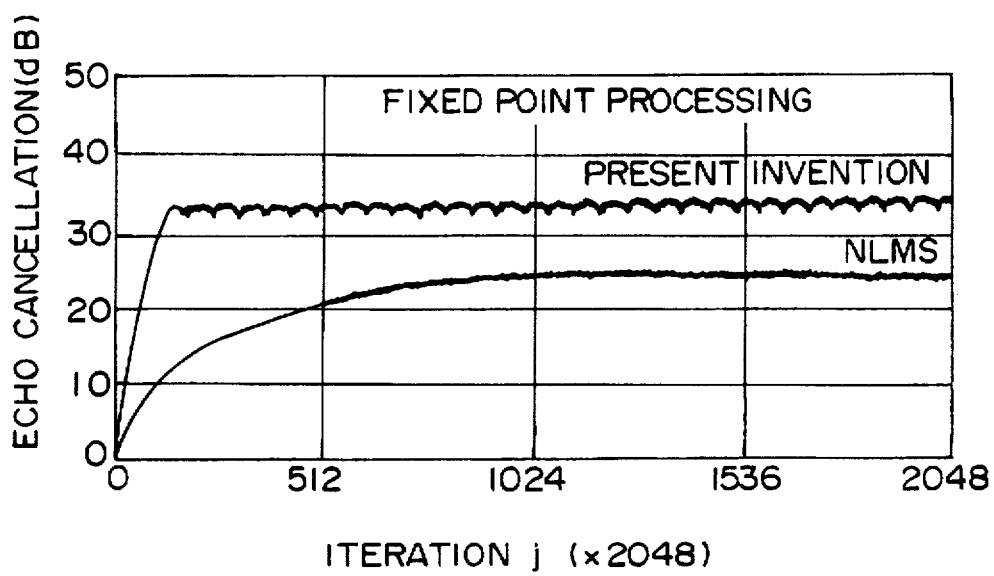
FIG. 10 shows a graphical representation of a convergence property of the apparatus for estimating filter coefficients according to the present invention, the convergence property being wholly calculated using fixed-point processing.

FIG. 10 shows a graphical representation of a convergence property of the apparatus for estimating filter coefficients according to the present invention, the convergence property being wholly calculated using 16-bit fixed-point processing. In FIG. 10, the convergence property with the conventional NLMS algorithm which is wholly calculated by the fixed-point processing is also shown. In the calculation of FIG. 10, the number I of taps of the adaptive filter is 512, the adding number J is 512, the step gain K is 0.01, and the power ratio of the echo to the outside noise is assumed to be 10 dB.

From FIG. 10, even though the algorithm according to the present invention is calculated with the fixed-point processing, the convergence property according to the present invention similar to that of the NLMS algorithm with the floating-point processing may be obtained. Therefore, as shown in FIG. 10, it is confirmed that the convergence property according to the present invention is sharply improved as compared to that of the NLMS algorithm with the fixed-point processing.

In the following, the operation of the first embodiment of the apparatus will be discussed in further detail including a reason why the coefficient adjustment is effectively maintained. The product $E_j X_j(m)$ may be rearranged as follows:

$$E_j X_j(m) = [\Sigma \delta_j(i) X_j(i) + N_j] X_j(m) = \delta_j(m) X_j^2(m) + [\Sigma_m \delta_j(i) X_j(i) + N_j] X_j(m) \tag{24}$$

where $\Sigma_m$ is an adding operation for i=1 to I except for i=m. In the equation, required information for the m'th coefficient adjustment of the adaptive filter is present in the first term:

$$\delta_j(m) X_j^2(m) = [h_j(m) - H_j(m)] X_j^2(m), \tag{25}$$

wherein the required information is $[h_j(m) - H_j(m)]$.

Next, the coefficient adjustment is carried out every J samples. During an interval from j=nJ+1 to (n+1)J, the filter coefficient is not adjusted and remains fixed, and, thus, the adaptive filter coefficient $H_j(m)$ is maintained at a constant value $H_n(m)$. And, it is assumed that the characteristics of the unknown system (the impulse response of the echo path) is not changed until the coefficient of the adaptive filter converges. Therefore, the characteristics of the unknown system are assumed to be constant ($h(m) = h_j(m)$). $A_n(m)$ of the equation (21) is rearranged as follows when its m'th tap component is separated:

$$A_n(m) = \Sigma^*\delta_j(m)X_j^2(m) + \Sigma^*[\Sigma_m\delta_j(i)X_j(i) + N_j]X_j(m) \quad (26)$$

$$= \Sigma^*[h(m) - H_n(m)]X_j^2(m) + \Sigma^*[\Sigma_m\delta_j(i)X_j(i) + N_j]X_j(m)$$

$$= [h(m) - H_n(m)]\Sigma^*X_j^2(m) + \Sigma^*[\Sigma_m\delta_j(i)X_j(i) + N_j]X_j(m) \quad (27)$$

where $\Sigma^*$ is the adding operation for j=nJ+1 to (n+1)J.

In the first term of the equation (27), the power $P_n(m)$ of the far-end talker's signal provided by equation (22) is multiplied. Therefore, by obtaining the ratio of the power $P_n(m)$ provided by equation (22) (namely, normalizing by the power $P_n(m)$), the information required for adjusting the filter coefficients (the difference between the true value and the estimated value) may be derived as shown in a first term of the following equation.

$$A_n(m)/P_n(m)=[h(m)-H_n(m)]+\Sigma^*[\Sigma_m\delta_j(i)X_j(i)+N_j]X_j(m)/\Sigma^*X_j^2(m) \quad (28)$$

where $\Sigma^*$ is the adding operation for j=nJ+1 to (n+1)J.

From the above operation, the second term of the equation (24) which may cause the estimation error is reduced to 1/J because of the averaging effect in the present invention. Therefore, the convergence property according to the present invention is similar to the that of the conventional NLMS algorithm as shown in FIG. 9.

As a result, coefficient adjusting amounts $F_n(m)$ calculated according to the present invention are obtained by multiplying the step gain K with the first term of the equation (28), as shown by the following equation.

$$F_n(m)=K[h(m)-H_n(m)] \quad (29)$$

In the coefficient adjusting amounts defined by the equation (29), the division by the norm is not included unlike the adjusting amounts $D_j(m)$ calculated based on the conventional NLMS algorithm which includes that division. In the present invention, since the division is not included in an equation of the adjusting amounts, a decrease of the effective figure number of the calculation due to the division does not occur. Therefore, the coefficient adjustment may be maintained until the coefficient adjustment converges and the coefficient at the desired precision is obtained.

According to the present invention, since the coefficient adjusting amounts are derived as the equation [h(m)−$H_n(m)$], the numerator $A_n(m)$ generating the adjusting amounts becomes the same value as the power of the far-end talker's signal of the denominator $P_n(m)$. Therefore, the coefficient adjusting amounts may be derived regardless of an increase of the power of the far-end talker's signal or an increase of the number of taps of the adaptive filter. In this way, the problem that, when the coefficient adjusting amounts in the NLMS algorithm are reduced to less than the minimum expressed by the word length, the coefficient adjustment becomes invalid, may be prevented according to the present invention.

Next, a description will be given of conditions for positively operating the apparatus according to the present invention. For applying the apparatus according to the present invention to commercial equipment, the condition of the step gain needs to be determined. In the following, the condition of the step gain will be determined by using the NLMS algorithm with an infinite impulse response (IIR) filter.

First, by substituting the equation (28) into the equation (23), the equation of the coefficient adjustment according to the present invention is rearranged as follows:

$$H_{n+1}(m)=[h(m)+R_n(m)]K+(1-K)H_n(m) \quad (30)$$

where $$R_n(m)=\Sigma^*[\Sigma_m\delta_n(i)X_j(i)+S_j+N_j]X_j(m)/\Sigma^*X_j^2(m) \quad (31)$$

where $\Sigma^*$ is the adding operation for j=nJ+1 to (n+1)J.

Figure 11:
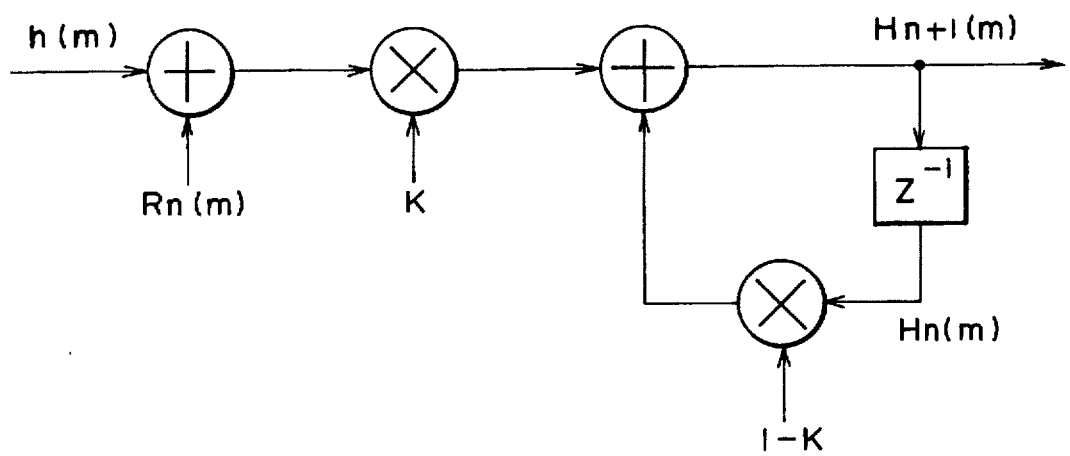
FIG. 11 shows an equivalent schematic diagram of a first-order IIR filter represented by an equation (31)

The above equation indicates a first-order IIR filter in which the m'th sample h(m) of the impulse response h(i) through the echo path is the input signal and $R_n$ comprising the estimation error $\delta_n(i)$ related to the sample of I except for m is the outside noise. FIG. 11 shows an equivalent schematic diagram of the first-order IIR filter represented by the equation (31).

In the configuration, on the assumption that the step gain K is less than zero (K<0), a factor (1−K) of the first-order feedback part becomes larger than 1, whereby the output of the filter diffuses. When the step gain K is zero (K=0), h(m) is prevented from being provided to the filter, whereby it becomes impossible to derive the coefficient $H_{n+1}(m)$. Therefore, for properly adjusting the adaptive filter coefficients, the step gain K needs to be larger than zero (K>0).

In the configuration of the filter shown in FIG. 11, an estimation error $\sigma_n(m)$ generated in the coefficient $H_n(m)$ is fed back to the output through the first-order recursive path. The estimation error $\sigma_n(i)$ generated in the coefficient $H_n(i)$ for i=1 to I except i=m also recurs at the output as disturbance $R_n(m)$ through a detour path. Therefore, the condition for ensuring the positive coefficient adjusting is that for the above two paths, an average power of the estimation error decreases. The condition is represented by an inequality when an average power for all taps of the estimation error $\sigma_n(i)$ generated by the coefficient adjustment in the n block is represented by an equation $\sigma_n^2$.

On the assumption that the average power (mean square) of the estimation error generated in one coefficient is represented by $\sigma_n^2$, the average power of the estimation error generated in (I−1) coefficients recurring to the input as the disturbance $R_n(m)$ is represented by $\sigma_n^2$ (I−1). The power is suppressed to $\sigma_n^2$ (I−1)/J through an arithmetic mean effect in the disturbance $R_n(m)$, and is multiplied by the step gain K to produce the estimation error $K^2 \sigma_n^2$ (I−1)/J. The final estimation error returns to the output.

On the other hand, the estimation error generated in the tap m is multiplied by (1−K) in the first-order recursive path and comes back to the output. The average power of this estimation error is represented by $(1-K)^2 \sigma_n^2$. The convergence condition for these estimation errors through the two paths requires the following inequality.

$$K^2(I-1)\sigma_n^2/J+(1-K)^2\sigma_n^2<\sigma_n^2 \quad (32)$$

In the case of $\sigma_n^2>0$ and K>0, the above inequity is rearranged as $$0<K<2J/(I+J-1) \quad (33)$$

Next, a description will be given of an application of the above-mentioned adaptive algorithm to the active noise control device. The NLMS algorithm may be applied to the active noise control device as a filtered-X NLMS algorithm.

Figure 3:
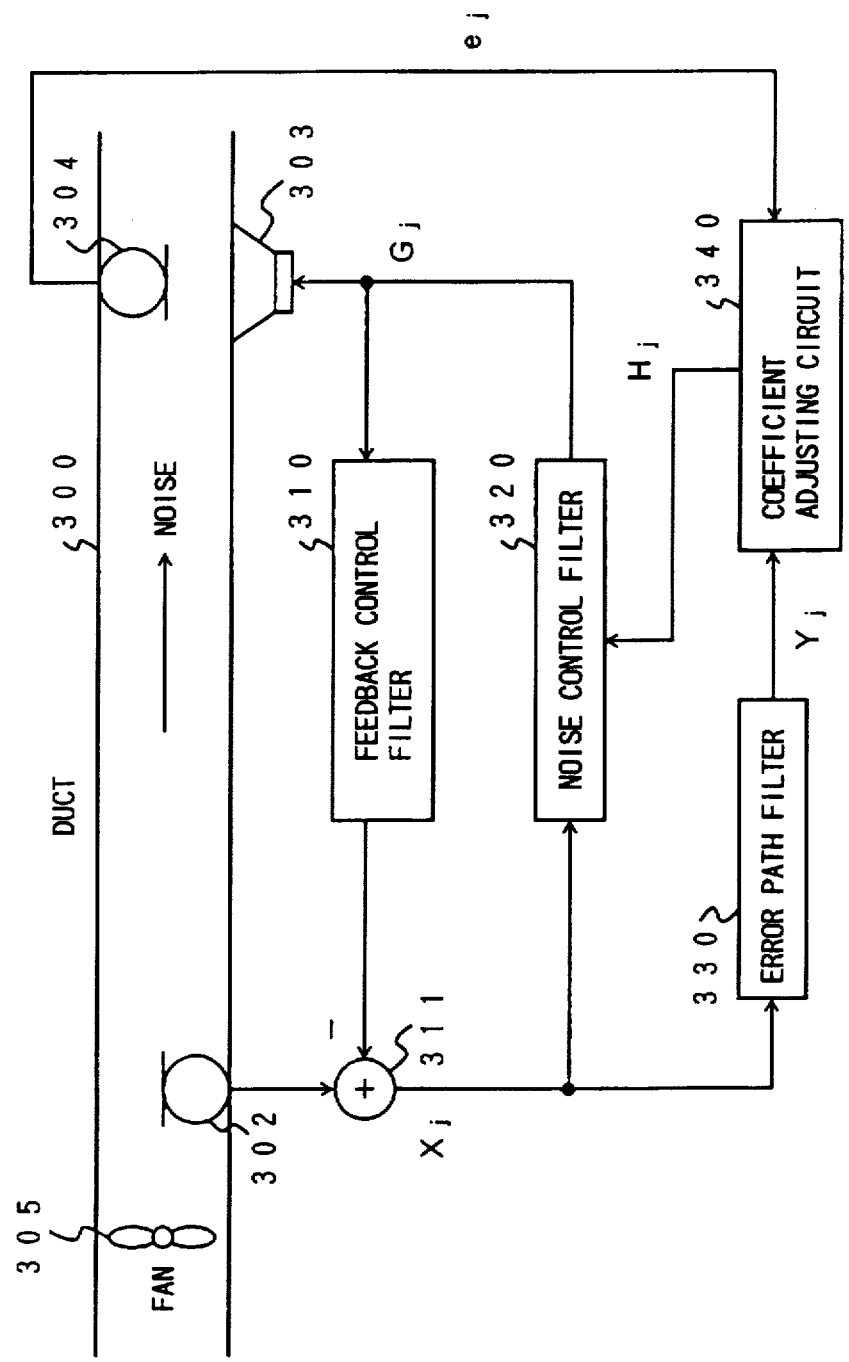
FIG. 3 shows a configuration of an active noise control device having an apparatus for estimating filter coefficients.
Figure 4:
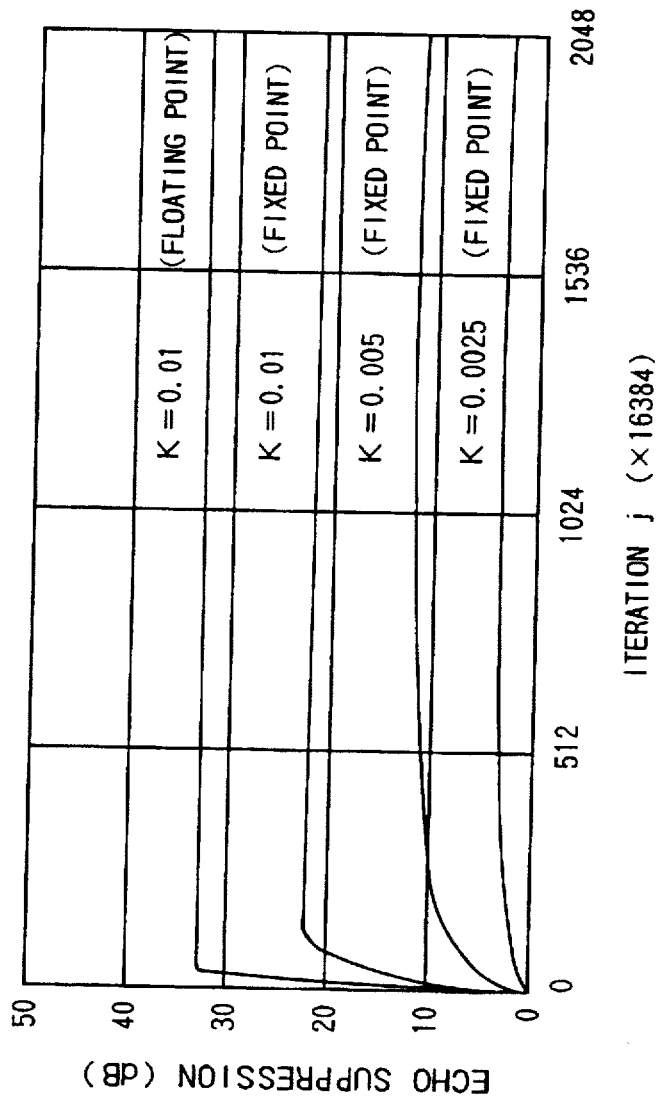
FIG. 4 shows a graphical illustration for explaining an influence of fixed-point processing on a convergence property.

In FIG. 3, the error path filter 330 simulates the characteristics of an error dispersion path from the noise control filter 320 to the coefficients adjusting circuit 340. When the coefficient of the error path filter 330 are represented by a(t), where t=1 to T, the output $e_j$ of the microphone 304 is given as $$e_j=\Sigma^T a(t)\Sigma[h(i)-H_{j-t}(i)]X_{j-t}(i) \quad (34)$$

where $\Sigma^T$ is an adding operation for t=1 to T. In the same way as the NLMS algorithm, the above equation is divided into the component related to the tap m and the component related to the taps except for m as follows:

$$e_j = \Sigma^T a(t)\Sigma[h(m)-H_{j-J}(m)]X_{j-J}(m)+\Sigma^T a(t)\Sigma_m[h(i)-H_{j-J}(i)]X_{j-J}(i) \quad (35)$$

where $\Sigma^T$ is an adding operation for t=1 to T, $\Sigma_m$ is an adding operation for t=1 to I except for i=m.

Because the convergence rate of the filtered-X algorithm is slow, the coefficient $H_{j-J}(m)$ is approximated as the constant value $H_n(m)$ for a time period of j=nJ+1 to (n+1)J. In this case, the above equation (35) is given as follows:

$$e_j \approx [h(m)-H_n(m)]\Sigma^T a(t)X_{j-J}(m)+\Sigma^T a(t)\Sigma_m[(h(i)-H_{j-J}(i)]H_{j-J}(i) \quad (36)$$

$$= [h(m)-H_n(m)]Y_j(t)+\Sigma^T a(t)\Sigma_m[h(i)-H_{j-J}(i)]X_{j-J}(i)$$

where $\Sigma^T$ is an adding operation for t=1 to T.

Next, the following equations are calculated based on the above approximation.

$$B_n(m)=\Sigma^* e_j Y_j(m) \quad (37)$$

$$Q_n(m)=\Sigma^* Y_j^2(m) \quad (38)$$

where $\Sigma^*$ is an adding operation for j=nJ+1 to (n+1)J.

A first term of a ratio of the above two equations indicates the difference between the estimated value of the coefficient and the true value as in the NLMS algorithm. Namely, when the coefficient adjustment represented by the following equation is carried out, the equation suggests that the algorithm according to the present invention is applied to the filtered-X NLMS algorithm provided to the active noise control device.

$$H_{n+1}(m)=H_n(m)+K\,B_n(m)/Q_n(m) \quad (39)$$

Figure 12:
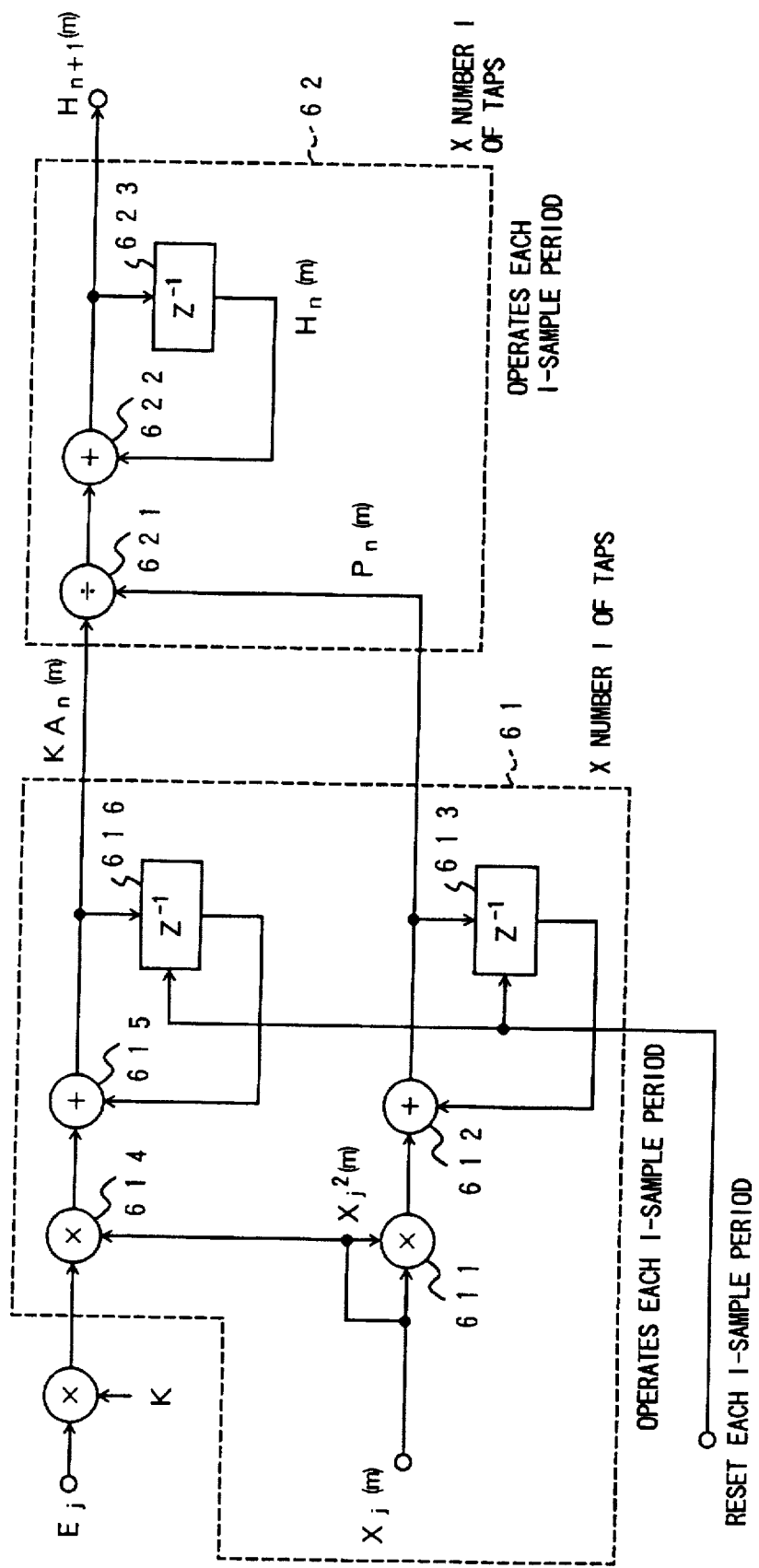
FIG. 12 shows a schematic diagram of a coefficient adjusting circuit according to the present invention.

Next, a description will be given of a circuit configuration of the apparatus according to the present invention. FIG. 12 shows a schematic diagram of the coefficient adjusting circuit according to the present invention. In FIG. 12, a block 61 calculates $K\,A_n(m)$ and $P_n(m)$ based on the equations (21) and (22). The block 61 comprises a multiplier 611 squaring the far-end talker's signal $X_j(m)$, a pair of a delay element 613 and an adder 612 accumulating the square value from the multiplier 611 to produce $P_n(m)$, a multiplier 614 multiplying K $E_j$ with $X_j(m)$, and a pair of a delay element 616 and a multiplier 615 accumulating the value from the multiplier 614 to produce K $A_n(m)$. The block 61 operates each I-sample time period, and the delay elements 613 and 616 are reset each I-sample time period. The block 61 needs to be processed for each tap (=1 to I) of the adaptive filter.

A block 62 operates each I- sample time period, and calculates $H_{n+1}(m)$ based on K $A_n(m)$ and $P_n(m)$. The block 62 comprises a divider 621 dividing K $A_n(m)$ with $P_n(m)$ to produce the coefficient adjusting amounts, a pair of an adder 622 and a delay element 623 adding the coefficient adjusting amounts to the previous coefficient $H_n(m)$. The block 62 needs to be processed for each tap (=1 to I) of the adaptive filter in the same way as the block 61.

FIG. 13 shows a schematic diagram of the coefficient adjusting circuit according to the conventional NLMS algorithm. In the circuit, in the calculation of the norm in the NLMS algorithm, the amount of calculation is reduced in the following way. Since $X_j(i)$ becomes $X_{j-i+1}$, the norm $\Sigma\,X_j^2(i)$ obtained at time j, an initial square value $X_{j-i+1}^2(i)$ constructing the norm $\Sigma\,X_j^2(i)$, and a latest square value $X_{j+1}^2(i)$ provided at time j+1 give the norm at time j+1 as follows:

$$\Sigma X_{j+1}^2(i)=\Sigma X_j^2(i)-X_{j-i+1}^2(i)+X_{j+1}^2(i) \quad (40)$$

In the coefficient adjustment according to the NLMS algorithm, when the required norm is rearranged by a representative $\Sigma\,X_j^2(i)$, the following equation is given.

$$\Sigma X_j^2(i)=X_j^2(1)+X_j^2(2)+X_j^2(3)\ldots+X_j^2(I) \quad (41)$$

In the above equation, I times the squaring and adding operations are required each sample time. However, the norm for the next time (j+1) is as follows:

$$\Sigma X_{j+1}^2(i)=X_{j+1}^2(1)+X_j^2(1)+X_j^2(2)\ldots+X_j^2(I-1) \quad (42)$$

By the above equation, the amount of calculation may be reduced.

In the configuration shown in FIG. 13, a shift register 520 of I taps is added to hold the square value of the far-end talker's signal $X_j$. The shift register 520 subtracts the initial square value (a last tap output of the shift register 520) from the norm stored in a register 510, and adds the latest square value of the currently provided far-end talker's signal (input of the shift register 520) to the norm. Therefore, the norm is adjusted each sample time.

In the above calculation method, the initial value stored in the register 510 is held constant, therefore, the register 510 and the shift register 520 need to be reset to zero before starting.

When the norm is calculated with the floating-point processing, for addition of values having different exponents, the value having a smaller exponent is adjusted to the value having a larger exponent. Therefore, there is a difference between an oldest square value to be subtracted from the norm by shifting the shift register 520 in a right direction and an oldest square value remaining as the norm in the register. If the difference remains, the difference is accumulated, and, thus, the norm will diffuse. In the calculation method shown in FIG. 13, by adding the adder 530 and the register 531, an additional function of simply calculating the norm is provided. In that configuration, for each I sample time, the norm stored in the register 510 is replaced by a calculation result from the additional function, and, thus, the norm is prevented from diffusing. By the above operation, an accumulation of the error due to the usage of floating-point processing may be reduced to less than the I sample time.

Comparing the processing amounts of the circuit configuration according to the present invention with the circuit configuration according to the conventional NLMS algorithm, there are differences per one sample time as follows:

1) Conventional NLMS Algorithm (in FIG. 13):
   multiplication of the remaining echo with the far-end talker's signal (I times),+squaring of the far-end talker's signal (one time),+shifting of the square value in the shift register 520 in the right direction (one time), +subtraction of the oldest square value (one time),+ addition of the latest square value (one time),+addition for the norm to be switched to prevent accumulation of the error (one time),+addition for the coefficient adjustment (I times),+division and multiplication for normalization by the norm (one time for the division, I times for the multiplication).

2) Algorithm according to the present invention (in FIG. 12):
   multiplication and addition of the remaining echo with the far-end talker's signal (each I times),+squaring of the far-end talker's signal (I times),+addition of the square value (I times),+addition for the coefficient adjustment (I times),+division for normalization by the power of the far-end talker's signal (I times).

In the algorithm according to the present invention, a calculation procedure is simpler, but the processing amounts are larger. In the algorithm according to the present invention, "shifting of the far-end talker's signal in the shift register in the right direction (one time)" corresponding to "the shifting of the square value in the shift register 520 in the right direction (one time)" in the conventional NLMS algorithm is omitted, since the shift register constructing the adaptive filter is also available. Though the addition for the coefficient adjustment is carried out one time per I-sample time period, the processing amounts are given as maximum amounts.

As mentioned above, in the algorithm according to the present invention, though a control procedure and the configuration may be simplified, there is a problem that the processing amounts are larger. A large amount of processing is due to the calculation of the normalized power and the configuration in which the division is carried out for each tap.

Figure 14:
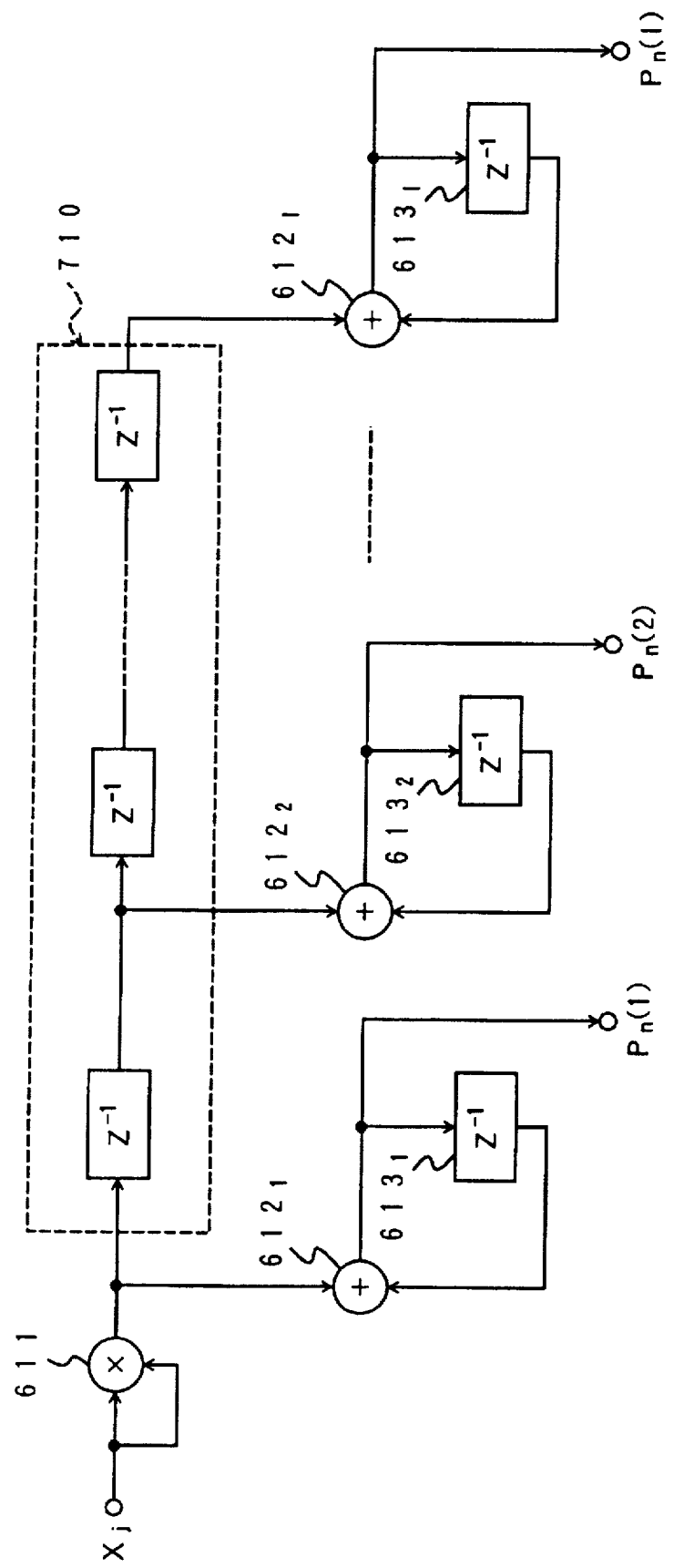
FIG. 14 was a configuration for reducing processing amounts of an algorithm according to the present inventions.

[1] Method 1 of simplifying the calculation of the power $P_n(m)$ of the far-end talker's signal FIG. 14 shows a configuration for reducing the processing amounts of the algorithm according to the present invention. In the configuration, in the same way as the configuration shown in FIG. 13, a shift register 710 is provided to store the square of the far-end talker's signal. The shift register 710 is constructed with (I−1) taps, and in each tap, the square of the far-end talker's signal is stored. The square is successively shifted for each sample timing. An output of each tap is provided to adder $612_i$. A pair of the adder $612_i$ and a delay element $613_i$ calculates the accumulation $P_n(i)$ of the square $X_j^2$ for each tap of the adaptive filter.

In the circuit configuration shown in FIG. 14, the squaring calculation required at each tap may be eliminated. While, though the right-direction shifting operation in the shift register 710 storing the square value is required, the number of times of the processing of squaring the far-end talker's signal may be reduced to one per one sample timing.

[2] Method 2 of simplifying the calculation of the power $P_n(m)$ of the far-end talker's signal In the algorithm according to the present invention, $h(m)−H_n(m)$ is derived from the coefficient adjusting amounts $E_j X_j(m)$. Therefore, even if the accumulation of the coefficient adjusting amounts $E_j X_j(m)$ and the calculation of the norm are delayed by the same given time period and are calculated, $h(m)−H_n(m)$ may also be derived. When coefficients of the adaptive filter are successively delayed by one sample time and the coefficients are adjusted, the addition for the coefficient adjustment of the adaptive filter which has been carried out in one sample time is distributed in respective sample times. Therefore, the maximum processing amounts for one sample time may be extremely reduced.

In this way, in the configuration, for example, for one sample time, one coefficient adjustment is carried out. In the previously-mentioned algorithm according to the present invention, complete coefficient adjustment of the adaptive filter is carried out each period of I samples. Therefore, in the configuration proposed here, the addition for the coefficient adjustment and the division for the normalization are distributed to one operation per each sample time. Accordingly, the processing amounts may be reduced.

The far-end talker's signal $X_j(i)$ may be written by $X_{j-i+1}(i)$, and the following equations are derived from the equations (24) and (25).

$$A_n(m) = [h(m) - H_n(m)]\Sigma^* X^2_{j-m+1}(i) + \qquad (43)$$
$$\Sigma^*[\Sigma_m \delta_j(i) X_{j-i+1}(i) + S_j + N_j] X_{j-m+1}(i)$$

$$P_n(m) = \Sigma^* X^2_{j-m+1}(i) \qquad (44)$$

To adjust the one coefficient per one sample time, the time period for the addition is changed to, for example, a time period $j=nJ+1+m−1$ to $(n+1)J+m−1$ for the tap m, the above equations are rearranged as follows:

$$A_n(m) = [h(m) - H_n(m)]\Sigma^{**} X^2_{j-m+1}(i) + \qquad (45)$$
$$\Sigma^{**}[\Sigma_m \delta_j(i) X_{j-i+1}(i) + S_j + N_j] X_{j-m+1}(i)$$

$$P_n(m) = \Sigma^{**} X^2_{j-m+1}(i) \qquad (46)$$

where $\Sigma^{**}$ is an adding operation for $j=nJ+1+m−1$ to $(n+1)J+m−1$.

The coefficient adjusting amounts $[h(m)−H_n(m)]$ are derived based on the ratio of these equations. In these equations, a time $j−m+1$ is behind a time $j$ by an time interval $m−1$. Therefore, the addition of the square $X_{j-m+1}^2$ (i) for $j=nJ+1+m−1$ to $(n+1)J+m−1$ is identical to the addition of the square $X_j^2(i)$ for $j=nJ+1$ to $(n+1)J$. As a result, the right term of the equation (46) is rewritten as follows:

$$\Sigma^{**} X^2_{j-m+1}(i) = \Sigma^* X_j^2(i) \qquad (47)$$

where $\Sigma^*$ is an adding operation for $j=nJ+1$ to $(n+1)J$, $\Sigma^*$ is an adding operation for $j=nJ+1+m−1$ to $(n+1)J+m−1$.

The above equation suggests that the accumulation of the square value $X_j^2(i)$ for $j=nJ+1$ to $(n+1)J$ may be available as the normalized power required for adjusting each coefficient regardless of the taps.

Figure 15:
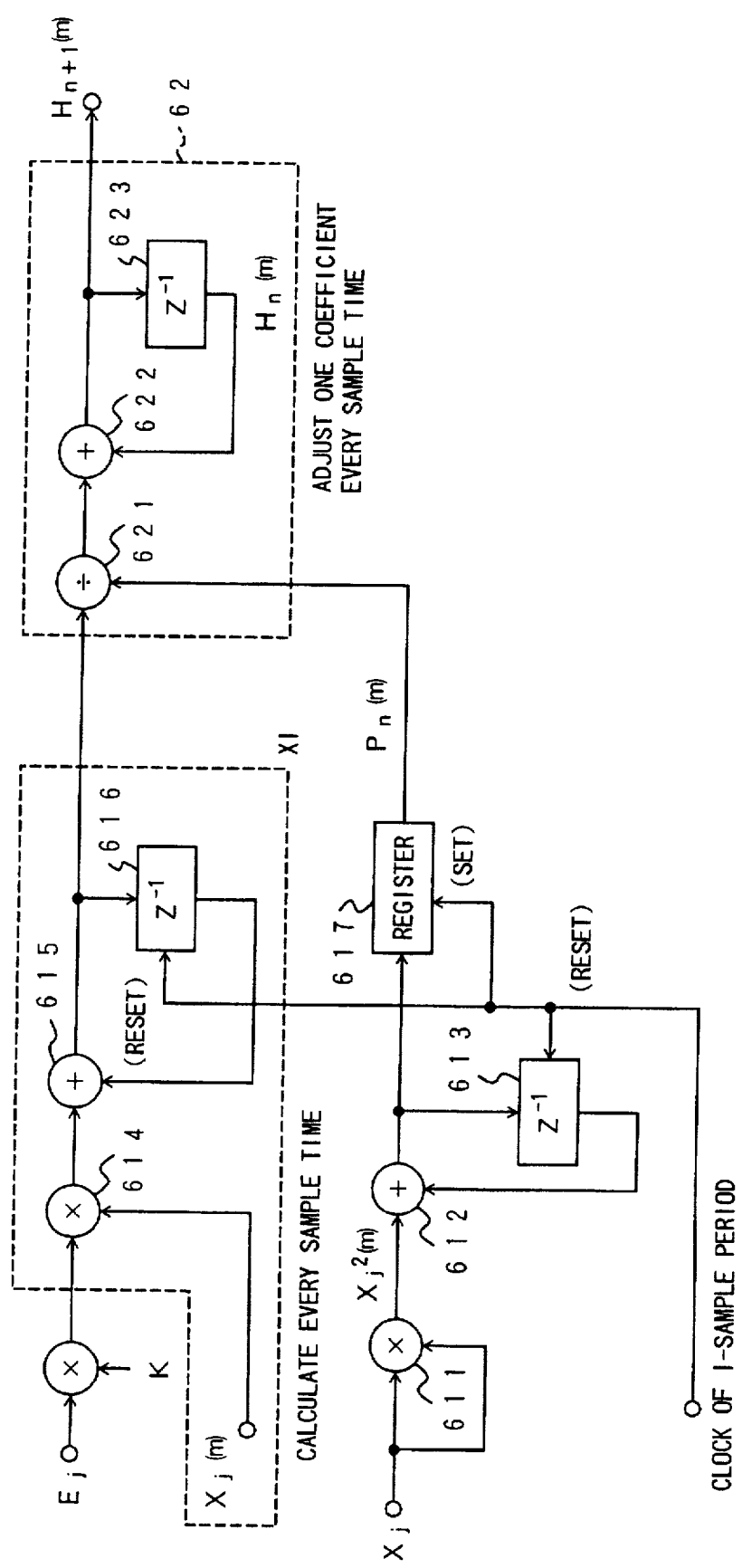
FIG. 15 shows a configuration provided with a moving average method for reducing the processing amounts of the algorithm according to the present invention.

The above-proposed configuration is referred to as a moving average method or a distribution adjusting method. FIG. 15 shows a configuration provided with the moving average method for reducing the processing amounts of the algorithm according to the present invention. In comparison with the configuration shown in FIG. 12, the output of the circuit constructed with the adder 612 and the delay element 613 is provided to the block 62 through the register 617, and the register 617 is reset every I sample times.

In the embodiment of FIG. 15, a signal $X_j$ is squared in the multiplier 611, and the square is accumulated for I samples in the adder 612 and the delay element 613. By the accumulated value for I samples, a content of the register 617 is replaced every I samples, and the addition value of the delay element 613 is reset to zero every I samples to prepare for the next accumulation. In this way, the power $P_n(m)$ of the far-end talker's signal is provided from the register 617. In this case, since the power $P_n(m)$ in the register 617 is held for only a period of the I sample times, each filter coefficient is adjusted one by one every one sample time by using the power $P_n(m)$ stored in the register 617.

FIG. 16 shows a comparison of the processing amounts of the conventional NLMS algorithm and the algorithms according to the present invention. This comparison suggests that the processing amounts in the moving-average type algorithm according to the present invention may be extremely reduced.

Figure 17:
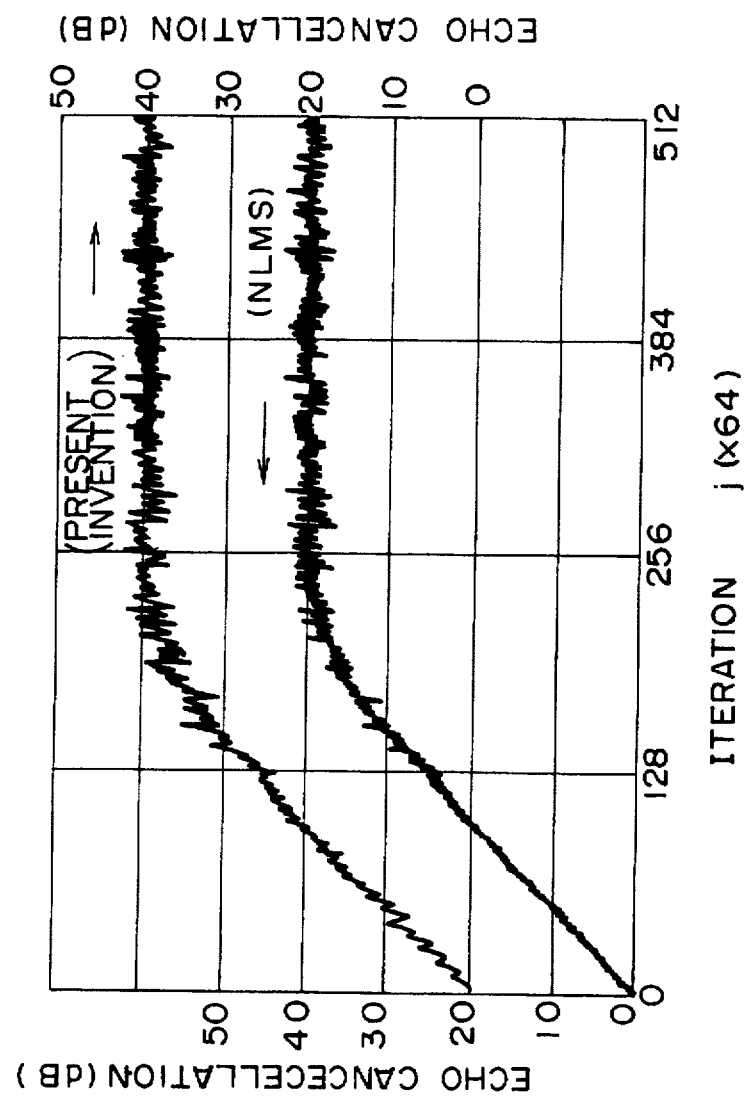
FIG. 17 shows a comparison of simulated convergence properties of the moving-average-type algorithm according to the present invention and the conventional NLMS algorithm with the floating-point processing.

FIG. 17 shows a comparison of simulated convergence properties of the moving-average-type algorithm according to the present invention and the conventional NLMS algorithm with the floating-point processing. The calculation conditions in FIG. 17 are the same as that in FIG. 9. Therefore, in the simulation shown in FIG. 17, the number of taps of the adaptive filter and the time interval of the impulse response of the echo path are both 512, the step gain K is 0.2, and the power ratio of the echo to the outside noise is assumed to be 30 dB. The amount of echo cancellation is illustrated by averaging the values which has been obtained for 64 sample times. The simulation results shown in FIG. 17 show that there is substantially no difference between both convergence properties. Since both convergence properties are almost the same, the illustrations are shifted from each other by 20 dB to clarify each convergence property. And, the simulation results also suggest that the algorithm according to the present invention may realize almost the same characteristics as those of the conventional NLMS algorithm with the floating-point processing.

[3] Simplification of the division by the power $P_n(m)$ of the far-end talker's signal In the configuration shown in FIG. 15, the stored accumulated value is changed to its reciprocal and is stored in the register. In this case, the division by the power $P_n(m)$ of the far-end talker's signal is replaced by the multiplication in the same way as the NLMS algorithm. As a result, the processing amounts according to the present invention are reduced to:

multiplication and addition of the remaining echo with the far-end talker's signal (I times for each),+squaring of the far-end talker's signal (one time),+addition of the square value (one time),+addition for the coefficient adjustment (one time),+division and multiplication for normalization by the norm (one time for each).

In comparison with the processing amounts of the conventional NLMS algorithm, multiplication for normalizing by the norm: I times are reduced to one time;

shifting of the square value in the shift register 520 in the right direction: one time is reduced to zero (the shift register also becomes unnecessary);

subtraction of the oldest square value: one time is reduced to zero;

addition of the latest square value: one time is reduced to zero;

addition for the norm to be switched to prevent accumulation of the error: one time is reduced to zero;

addition for the coefficient adjustment: I times are reduced to one time.

Further, the processes that the shift register and the register are reset to zero at the start are also eliminated.

[4] Prevention of the degradation of the echo cancellation

The NLMS algorithm may properly operate with fixed step gain, even if the power of the far-end talker's signal varies. However, the estimation error after the conversion is given as $$P_D = K P_N / [P_X(2-K)], \quad (48)$$

which suggests that the estimation error also changes according to the variation of the power of the far-end talker's signal.

When the power of the far-end talker's signal is less than a power value by which a desired echo cancellation is achieved based on the equation (48), the estimation error increases. As a result, the amount of the echo cancellation decreases and the operation of adjusting the coefficients becomes unstable. Therefore, in general, the echo canceller provided with the NLMS algorithm as the adaptive algorithm has a function of stopping the coefficient adjustment when the power of the far-end talker's signal is less than the power value required for obtaining the desired estimation precision. However, stopping the coefficient adjustment means a delay of tracking of state variation of the echo path. Therefore, a time period when the amount of the echo cancellation is less than the given value increases, and, thus, howling may strongly occur.

On the other hand, according to the present invention, the calculation of the power $P_n(m)$ for the normalization does not need to be restricted by the number of taps. Namely, $h(m)-H_n(m)$ may be derived for only the accumulation of the coefficient adjusting amounts $E_j X_j(m)$. Therefore, the minimum power of the far-end talker's signal by which the desired echo cancellation for the power of the outside noise is obtained (the power by which the coefficient adjustment is stopped in the NLMS algorithm) is given as a reference. If the coefficient adjustment is carried out when the power $P_n(m)$ is over the reference, even if the power of the far-end talker's signal decreases, the desired echo cancellation may be obtained and the coefficient adjustment may always be carried out.

Figure 18:
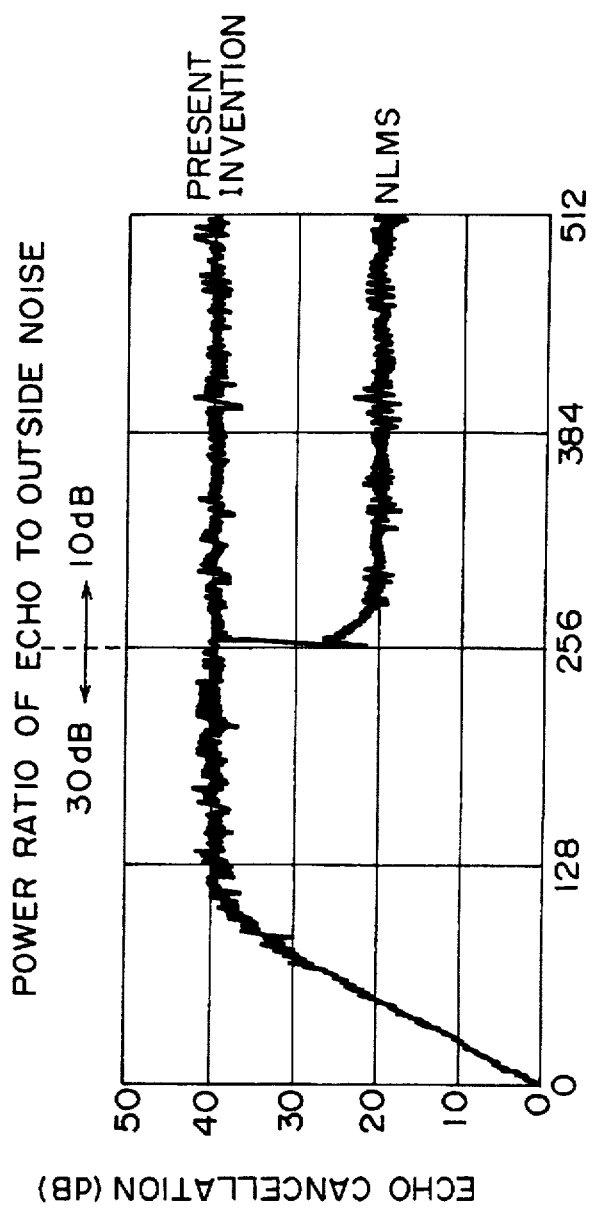
FIG. 18 shows convergence properties of the algorithm according to the present invention and the conventional NLM algorithm.

FIG. 18 shows convergence properties of the algorithm according to the present invention and the conventional NLMS algorithm. In calculations of the convergence properties, the given step gain and the reference power $P_0$ are set so as to obtain the echo cancellation of 40 dB in the power ratio of the echo to the outside noise 30 dB. In the conventional NLMS algorithm, in the power ratio of the echo to the outside noise 30 dB, the echo cancellation of 40 dB is obtained. However, in the power ratio of the echo to the outside noise 10 dB, the echo cancellation decreases to 20 dB. On the other hand, in the present invention, the echo cancellation of 40 dB may be obtained regardless of the power ratio of the echo to the outside noise.

[5] Improvement of the convergence speed

Since the convergence speed is determined by the step gain in the conventional NLMS algorithm, the convergence speed does not change even if the power of the far-end talker's signal is larger than the above-mentioned minimum value. On the contrary, the convergence speed in the algorithm according to the present invention may improve. In the algorithm according to the present invention, when the power of the far-end talker's signal is larger than the minimum value, the power $P_n(m)$ rises above over the reference power $P_0$ for carrying out the coefficient adjustment with a small number of adding processes. Therefore, the coefficient adjustment is carried out fast, and, thus, the convergence speed may be improved.

Figure 19:
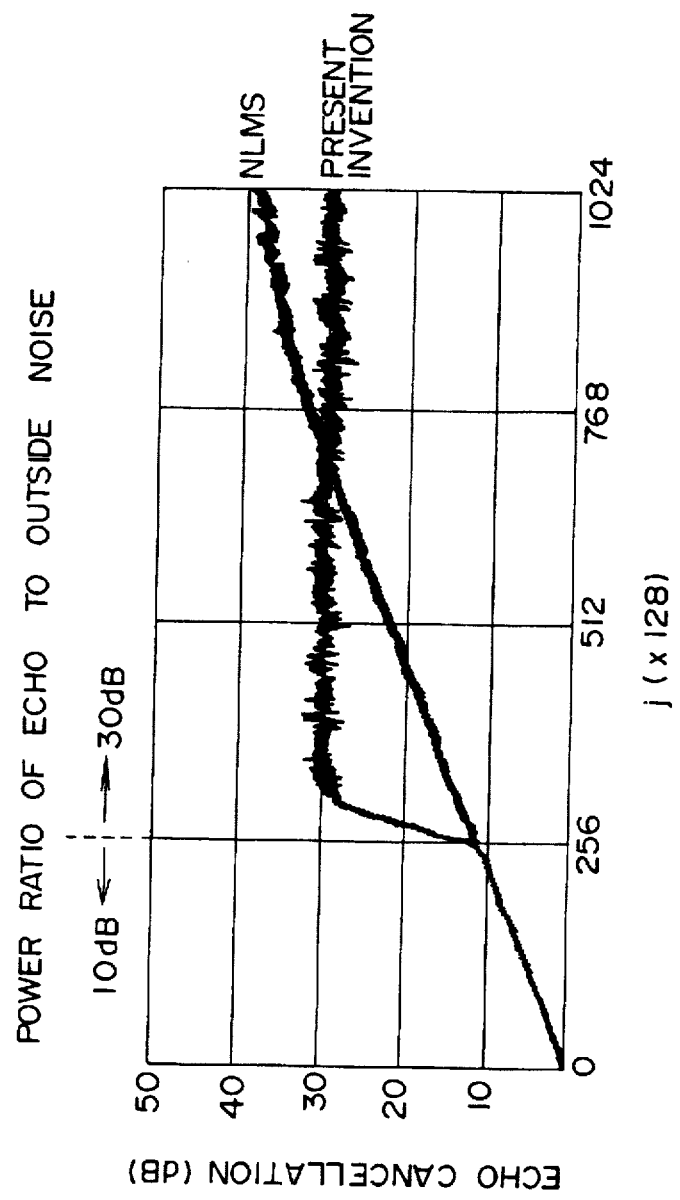
FIG. 19 shows convergence properties of the algorithm according to the present invention and the conventional NLMS algorithm.

FIG. 19 shows convergence properties of the algorithm according to the present invention and the conventional NLMS algorithm. In calculations of the convergence properties, the given step gain and the reference power $P_0$ are set so as to obtain the echo cancellation of 30 dB in the power ratio of the echo to the outside noise of 10 dB. And, at a time j=256×128, the power ratio of the echo to the outside noise is increased to 30 dB. In the algorithm according to the present invention, when the power of the far-end talker's signal increases, the convergence speed may be improved and the desired echo cancellation may be obtained fast. On the contrary, in the conventional NLMS algorithm, even if the power of the far-end talker's signal increases, the convergence speed does not change. It is considered that the increase of the power of the far-end talker's signal causes the echo cancellation to increase. However, in this case, the echo cancellation greater than the desired value is obtained, which increase may be unnecessary.

However, when the power of the far-end talker's signal is larger than the reference power $P_0$, the number of adding processes for calculating $P_n(m)$ decreases. And, $P_n(m)$ cannot suppress the numerator of the second term of the equation (28) giving the estimation error, and, thus, the coefficient adjustment may be unstable. For ensuring the stable operation of the coefficient adjustment, the estimation error included in the coefficient adjusting amounts $K A_n(m)/P_n(m)$ needs to be less than the estimation error included in the coefficient adjusting amounts $2 E_j X_j(m)/\Sigma X_j^2(i)$ which are obtained for the upper limit $K=2$ of the stable convergence condition ($0<K<2$) determined in the NLMS algorithm. On the other hand, it is known that the step gain $K$ with which the convergence speed is fastest is 1 and the estimation error increases when the step gain is larger than 1 ($K>1$). Therefore, to improve the convergence speed, the estimation error included in the coefficient adjusting amounts $K A_n(m)/P_n(m)$ is desired to be less than the estimation error included in the coefficient adjusting amounts $E_j X_j(m)/\Sigma X_j^2(i)$. Namely, it is desired that the following equation is satisfied.

$$P_n(m)/K \geq \Sigma X_j^2(i) \qquad (49)$$

When it is considered that the coefficient adjustment is carried out based on the reference power $P_0$, the above equation is rearranged as follows:

$$P_0/K \geq \Sigma X_j^2(i) \qquad (50)$$

In this case, when the square of the far-end talker's signal reaches the reference power $P_0$ with the number L of adding processes and the average of the square of the far-end talker's signal is $\sigma_x^2$, the above equation is equivalent to the following equation.

$$\sigma_x^2 L/K \geq \sigma_x^2 I \qquad (51)$$

Therefore, the number L of adding processes needs to satisfy the following relationship.

$$L \geq K I \qquad (52)$$

The relationship suggests that the lower limit of the number of adding processes needs to be restricted by $K I$.

Figure 20:
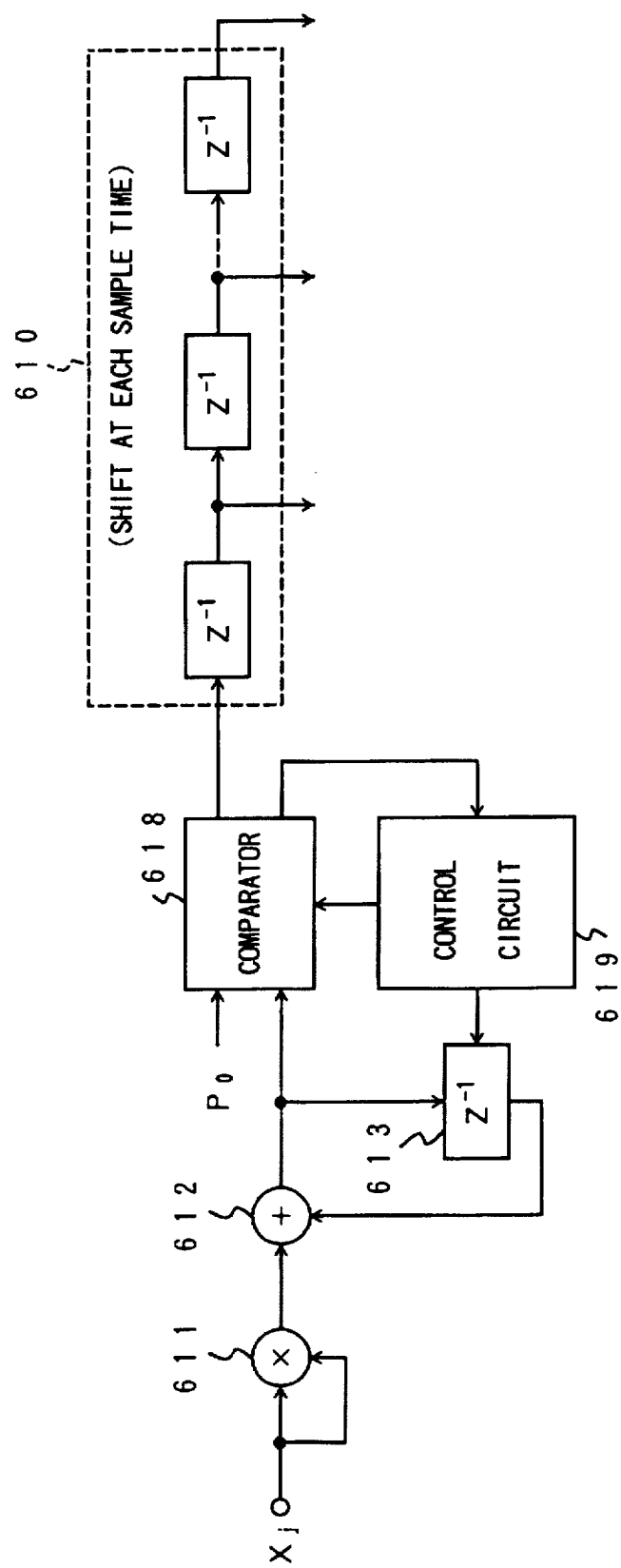
FIG. 20 shows a circuit configuration for determining the number of adding processes from an integration value.

[6] Circuit configuration for determining the number of adding processes from an integration value FIG. 20 shows a circuit configuration for determining the number of adding processes from an integration value. In the drawing, the multiplier 611 calculates the square of the far-end talker's signal $X_j$. A pair of the adder 612 and the delay element 613 accumulates the square. A comparator 618 compares the accumulated value for the addition with the reference power $P_0$ and produces the integration value $P_n(m)$ (or $P_0$) or 0 to the shift register 610. A control circuit 619 counts the number of the square of the far-end talker's signal, and controls the comparator 618 to stop writing the sum $P_n(m)$ of the square or $P_0$ when the power of the far-end talker's signal is over the reference power $P_0$ at the number of adding processes less than $K I$. The output of each tap of the shift register 610 corresponds to each coefficient of the adaptive filter.

In the coefficient adjustment of this circuit, the tap outputs of the shift register 610 are examined every sample time. When the tap output is 0, the coefficient adjustment is not carried out. When the normalized power $P_n(m)$ (or $P_0$) is stored, the coefficient adjustment is carried out. In this way, the calculation of the normalized power is simplified. In the circuit configuration shown in FIG. 20, when the sum of the square of the far-end talker's signal is over the reference power $P_0$, the sum $P_n(m)$ (or $P_0$) is written into the shift register 610, and when the sum is not over the reference power $P_0$, 0 is written into the shift register 610. On the other hand, to prevent the coefficient adjustment from diffusing, the number of adding processes of the square of the far-end talker's signal is simultaneously counted. When the power of the far-end talker's signal is over the reference power $P_0$ for the number of adding processes less than $K I$, the control circuit 619 controls the comparator 618 to stop writing the sum $P_n(m)$ of the square (or $P_0$) into the shift register 610. In this case, when the value to be written into the shift register 610 is set to the reciprocal of the normalized power, the dividing process in the normalizing process may be replaced by the multiplying process.

Figure 21:
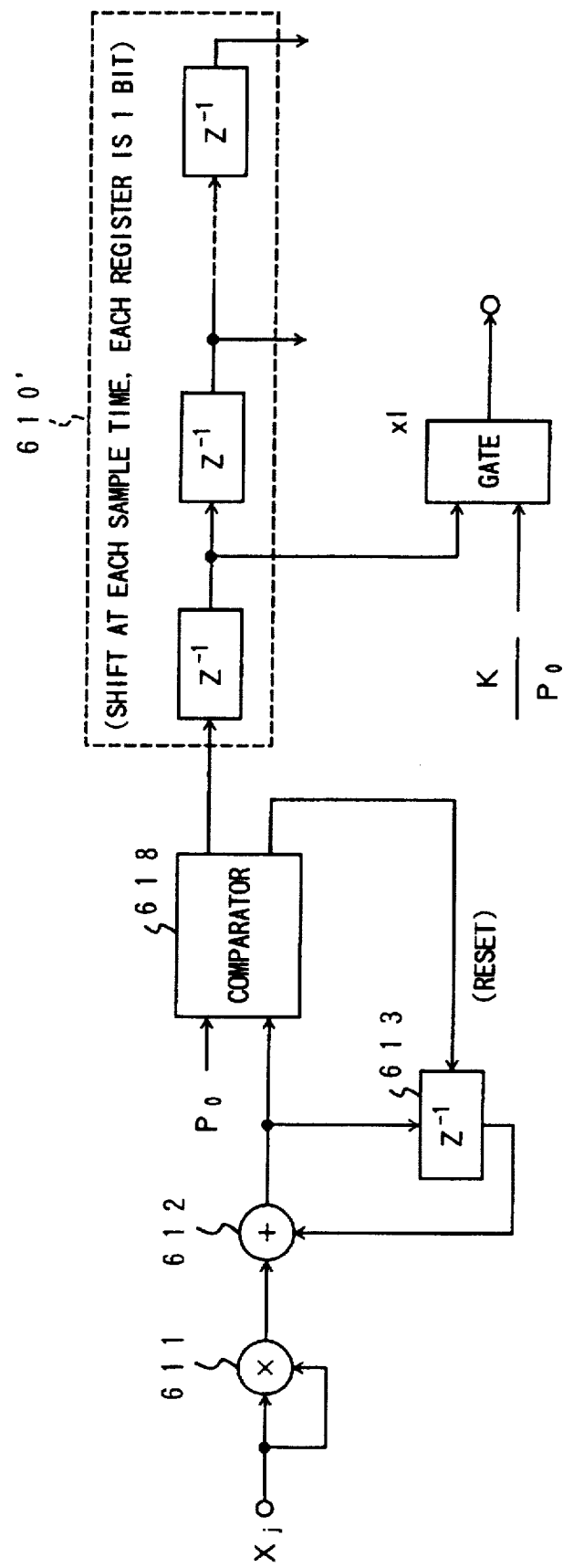
FIG. 21 shows a circuit configuration for indicating a timing of the coefficient adjustment by the register storing a flag.

[7] A method of indicating a timing of the coefficient adjustment by the register storing a flag FIG. 21 shows a circuit configuration of indicating a timing of the coefficient adjustment by the register storing a flag. When each magnitude of signals is adjusted so that the number of adding processes of the square could not exceed $K I$ even if the amplitude of the far-end talker's signal increases by the small step gain being set, the normalized power may be given as the fixed value $P_0$. In this case, the reciprocal is always given as the constant value, and, thus, it is unnecessary to store $P_0$ or the reciprocal. It is important to clarify the timing for the coefficient adjustment. When the timing is obtained, the coefficient adjusting amounts may be calculated by using an additionally prepared reciprocal. In FIG. 21, as the circuit indicating the timing, a shift register 610' storing a 1-bit coefficient adjustment flag is provided. If a constant value multiplied with the step gain is provided instead of the reciprocal, the multiplying process of the step gain will be unnecessary.

[8] Simplification of the normalizing process

When the normalizing process can be carried out with the constant value as mentioned above, if the reference power is determined so as to equalize $K/P_0$ to $2^k$, the normalizing process may be carried out by shifting data of the shift register.

[9] A method 1 in which the timing of the coefficient adjustment is given by an integral multiple of the number of taps In the method, the lower limit of the number of adding processes is given by the number I of taps of the adaptive filter, the maximum value which is obtained by the number I of adding processes of the square of the far-end talker's signal is given by $P_m$, the sum of the square by which the desired estimation error is obtained is given by $P_0$, and the step gain K is given so that $P_m/(K P_0)$ could be a positive integral number. Further, a time period writing the sum $P_n$ of the square of the far-end talker's signal into the register is given by I sample times. When the sum $P_n$ becomes equal to or less than $P_m$ before the timing of writing the sum $P_n$, the writing process is delayed until the next writing timing. In this case, the coefficient adjustment is carried out at the timing given by the integral multiples of I sample times. Therefore, the shift register storing $P_n$ shown in FIG. 20 is available instead of the register shown in FIG. 15. Further, $K P_n$ may be stored instead of $P_n$.

[10] A method 2 in which the timing of the coefficient adjustment is given by an integral multiple of the number of taps In the above method 1, the sum $P_n(m)$ of the square of the far-end talker's signal stored in the register becomes $P_m$ when the sum $P_n(m)$ is identical to the maximum $P_m$ in the time period of writing to the register. In the other time period except for the writing time period, the sum $P_n(m)$ satisfies $P_m<P_n(m)<2P_m$. When the convergence speed is not so important in, for example, the active noise control device, the coefficient adjustment may be the upper limit $2 P_n(m)$. The value of $2 P_n(m)$ may be previously determined, and may also replaced by $2 K P_n(m)$. Further, the value of $2 P_n(m)$ may be approximated to $2^k$ or $2^{-k}$.

[11] A method of preventing the integration value from overflowing

When the integration value $A_n(m)$ and $P_n(m)$ are calculated with the fixed-point processing, if the number J of adding processes increases, an overflow may occur. In the method, both the integration value $A_n(m)$ and $P_n(m)$, or only $P_n(m)$, are supervised. When the overflow is detected in the addition of $E_j X_j(m)$ or $X_j^2(m)$, the integration value $A_n(m)$ and $P_n(m)$ are divided by 2, and after that the addition component $E_j X_j(m)$ or $X_j^2(m)$ is multiplied by $½^k$ (where k is the number of overflow) to be added. In this configuration, an error operation due to the overflow in the integration value $A_n(m)$ and $P_n(m)$ may be prevented.

As described above, in the apparatus for estimating filter coefficients according to the present invention, even if the word length is limited, the coefficient adjusting amounts are effectively utilized and the adaptive filter coefficients may be properly adjusted. Therefore, for the algorithm of the coefficient adjustment, the fixed-point signal processor may be applied. Accordingly, increase of the convergence speed and high stability of the convergence may be realized. Furthermore, the processing amounts and the cost of the apparatus may also be reduced.

However, in the above algorithm according to the present invention, there is a problem that the word length of $E_j X_j(m)$ or $X_j^2(m)$ is twice the word length of the reference signal $X_j(m)$. This problem may be resolved in the following simplified floating-point processing. In the processing, when the upper 16 bits of the product result are all zero, the lower 16 bits of the product result are derived as the product. When the upper 16 bits of the product result are not all zero, the upper 16 bits are derived as the product. However, in practical use, such processing makes the configuration complex. And, the advantage of the high-speed processing by using the fixed-point processing may be degraded. To overcome this problem, the second type of apparatus for estimating filter coefficients according to the present invention will be provided.

B. A second type of apparatus

Figure 22:
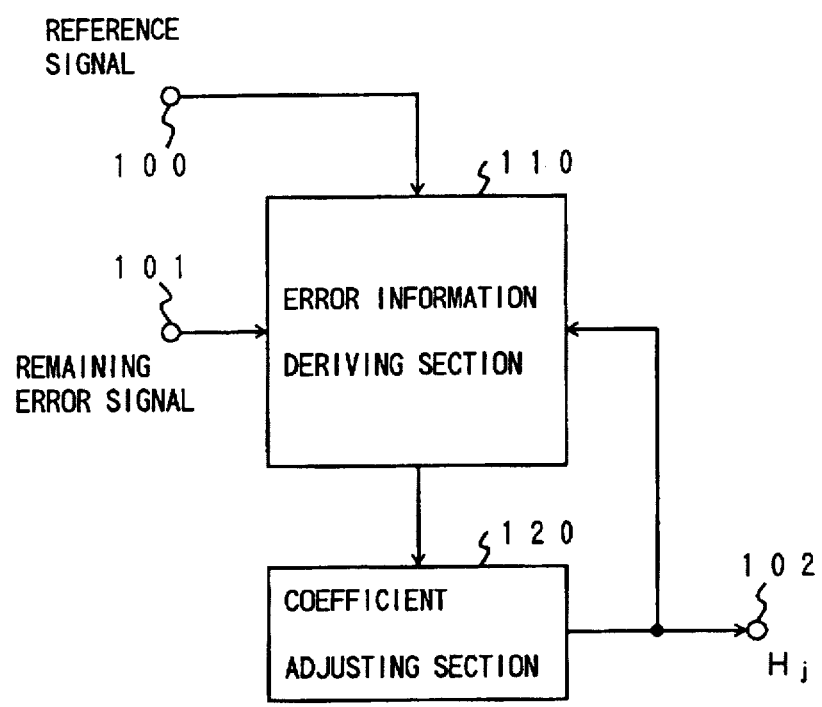
FIG. 22 shows an illustration for explaining a principle of second type of apparatus for estimating filter coefficients according to the present invention

Next, a description will be given of a principle of the second type of apparatus for estimating filter coefficients according to the present invention. FIG. 22 shows an illustration for explaining the principle of the second type of apparatus for estimating filter coefficients according to the present invention. The apparatus shown in FIG. 22 is an apparatus for estimating the coefficients of the FIR filter. The FIR filter produces the response equivalent to the impulse response of the unknown signal transmission system based on the reference signal provided to the unknown system and the response produced from the unknown system.

The apparatus according to the present invention shown in FIG. 22 comprises an error information deriving section 110 and a coefficient adjusting section 120. The error information deriving section 110 includes an input terminal 100 of the reference signal provided to the unknown system and an input terminal 101 of a remaining error signal difference between the response from the unknown system and the output of the FIR filter. The coefficient adjusting section 120 includes an output terminal 102 producing the coefficients of the FIR filter. The error information deriving section 110 derives error information of the difference between the impulse response of the unknown system and the coefficients of the FIR filter by calculation based on an sign of the reference signal and the absolute value of the remaining error signal. The coefficient adjusting section 120 stores the information obtained in the error information deriving section 110 and adds it to the coefficient of the FIR filter.

When the difference between the response from the unknown system and the output of the FIR filter is provided through a second unknown signal transmission system (second unknown system), the reference signal (second reference signal) provided to the input terminal 100 is given by the output of the FIR filter simulating the response from the second unknown system. The remaining error signal provided to the input terminal 101 is the response from the second unknown system.

In the apparatus, the difference between the response from the unknown system and the output of the FIR filter and the sign of the reference signal are multiplied with each other and are accumulated for a given time period to produce a first accumulation result. And, the absolute value of the reference signal is also multiplied for the given time period to produce a second accumulation result. Based on a ratio of the first accumulation result to the second accumulation result, the information related to the difference between the impulse response from the unknown system and the coefficient of the FIR filter is derived. Further, by using the information, the coefficients of the FIR filter are adjusted.

More specifically, in the apparatus, the number of coefficient adjustments per one sample time is restricted to a given number. The number of adding processes in the accumulation of the absolute value of the reference signal is set to the number less than that of taps of the FIR filter.

Next, descriptions will be given of embodiments of the second type of apparatus for estimating filter coefficients according to the present invention.

Figure 1:
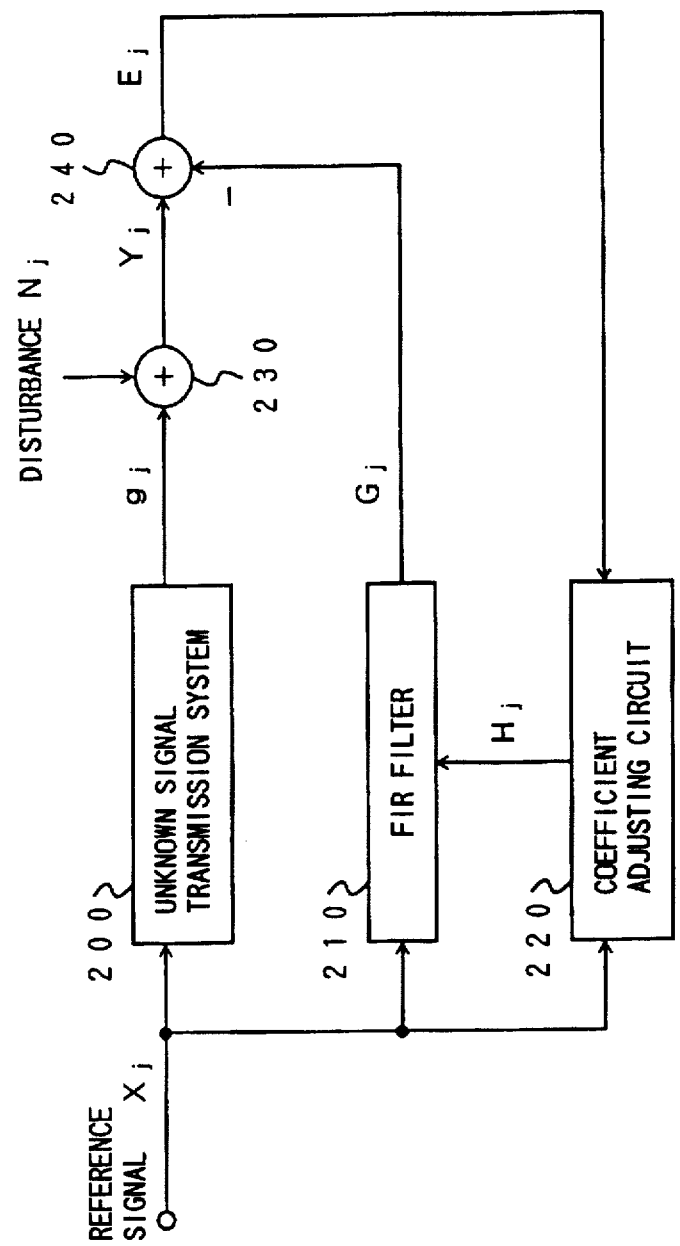
FIG. 1 shows a typical configuration of an apparatus for estimating filter coefficients which indicate characteristics of an unknown signal transmission system.

[1] Application to the above-mentioned basic-type algorithm according to the present invention The system to which the embodiment according to the present invention is applied is the same as that shown in FIG. 1. and the present invention is applied to the coefficient adjusting circuit 220.

In the embodiment, the product of the remaining error signal $E_j$ and the reference signal $X_j(m)$ is replaced by the following equation.

$$E_j sgn[X_j(m)]=[\Sigma\delta_j(i)X_j(i)+N_j]sgn[X_j(m)]=\delta_j(m)abs[X_j(m)]+ [\Sigma_m \delta_j(i)X_j(i)+N_j]sgn[X_j(m)] \quad (53)$$

where a function of $sgn[X_j(m)]$ means the sign of $X_j(m)$, and a function of $abs[X_j(m)]$ means the absolute value of $X_j(m)$. In this equation, the m'th required coefficient adjusting amount of the FIR filter 210 is derived from its first term:

$$\delta_j(m)abs[X_j(m)]=[h_j(m)-H_j(m)]abs[X_j(m)]. \quad (54)$$

In the processing, the coefficient adjustment is carried out every J sample times in the basic algorithm according to the present invention. Therefore, for a time period j=nJ+1 to (n+1)J, the coefficient is fixed to $H_n(m)$, and the characteristics of the unknown system (the impulse response of the echo path) is considered to be constant ($h(m)-H_j(m)$) until the convergence of the coefficients of the adaptive filter. Therefore, the equation (21) is given by the following equation.

$$A_n(m) = \Sigma^J \delta_j(m) abs[X_j(m)] + \Sigma^J[\Sigma_m \delta_j(i) X_j(i) + N_j] sgn[X_j(m)] \quad (55)$$

$$= \Sigma^J[h(m) - H_n(m)] abs[X_j(m)] +$$

$$\Sigma^J[\Sigma^m \delta_j(i) X_j(i) + N_j] sgn[X_j(m)]$$

$$= [h(m) - H_n(m)]\Sigma^J abs[X_j(m)] +$$

$$\Sigma^J[\Sigma_m \delta_j(i) X_j(i) + N_j] sgn[X_j(m)]$$

where $\Sigma^J$ is an adding operation for j=nJ+1 to (n+1)J. Further, the power $P_n(m)$ of the reference signal in the equation (22) is given by the following equation.

$$P_n(m) = \Sigma^J abs[X_j(m)] \quad (56)$$

Then, by calculating the ratio of the above two equations (55) and (56), the required information $[h(m)-H_n(m)]$ for the coefficient adjustment is obtained from a first term of the equation of the ratio.

$$A_n(m)/P_n(m) = [h(m) - H_n(m)] + \quad (57)$$

$$\Sigma^J[\Sigma_m \delta_j(i) X_j(i) + N_j] sgn[X_j(m)]/\Sigma^J abs[X_j(m)]$$

In the above process, the word lengths (for example, 16 bits) of the absolute value of the product of the remaining error signal and the reference signal and the absolute value of the reference signal are respectively not extended twice. Therefore, the above-mentioned algorithm may resolve the problem present in the basic algorithm according to the present invention. Accordingly, the fixed-point processing which is applicable to the reference signal having the wide dynamic range may be realized.

Figure 23:
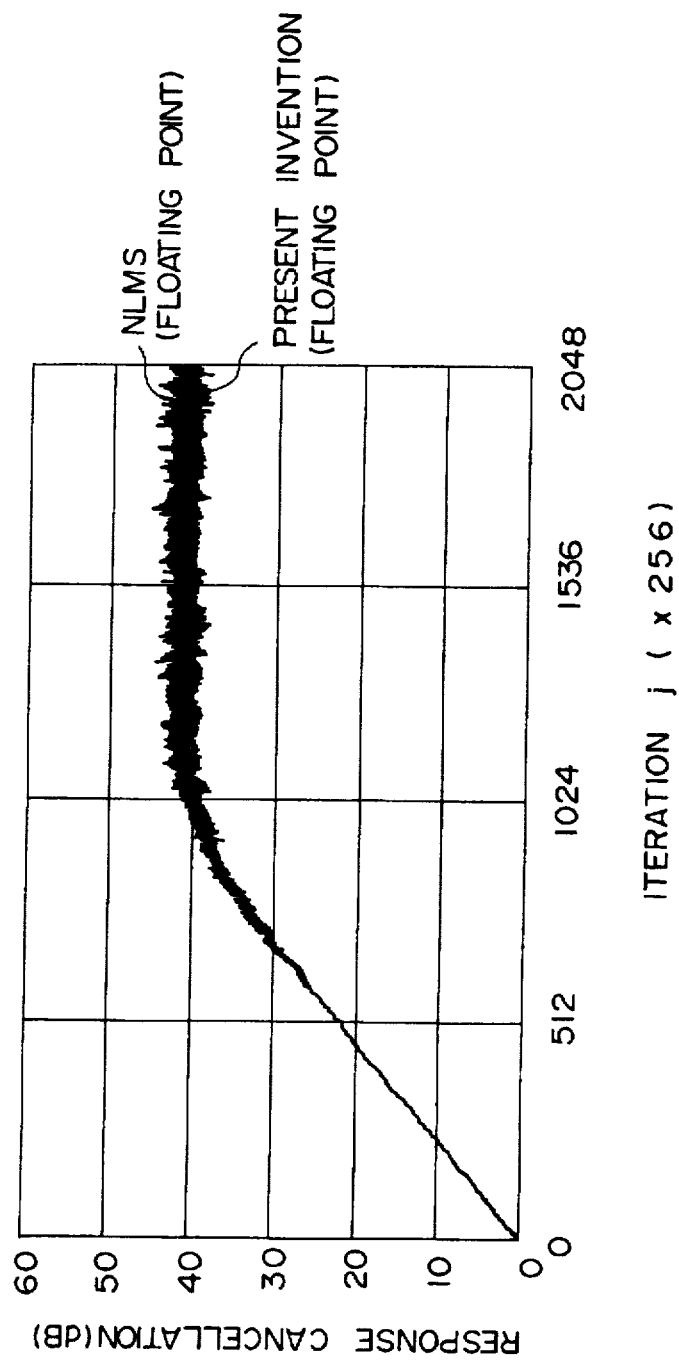
FIG. 23 shows a comparison of convergence properties simulated by the algorithm according to the present invention and the conventional NLMS algorithm, for both of which the floating-point processing is used.

As mentioned above, in the coefficient adjusting algorithm according to the present invention, the product of the remaining error signal and the sign of the reference signal is individually normalized by the absolute value of the reference signal. FIG. 23 shows a comparison of convergence properties simulated by the algorithm according to the present invention and the conventional NLMS algorithm, for both of which the floating-point processing is used. The algorithm according to the present invention may have the same increasing speed as that of the conventional NLMS algorithm with the floating-point processing. After the response cancellation converges, the converged response cancellation by the algorithm according to the present invention is degraded by approximately 2 dB as compared to the conventional NLMS algorithm.

Figure 24:
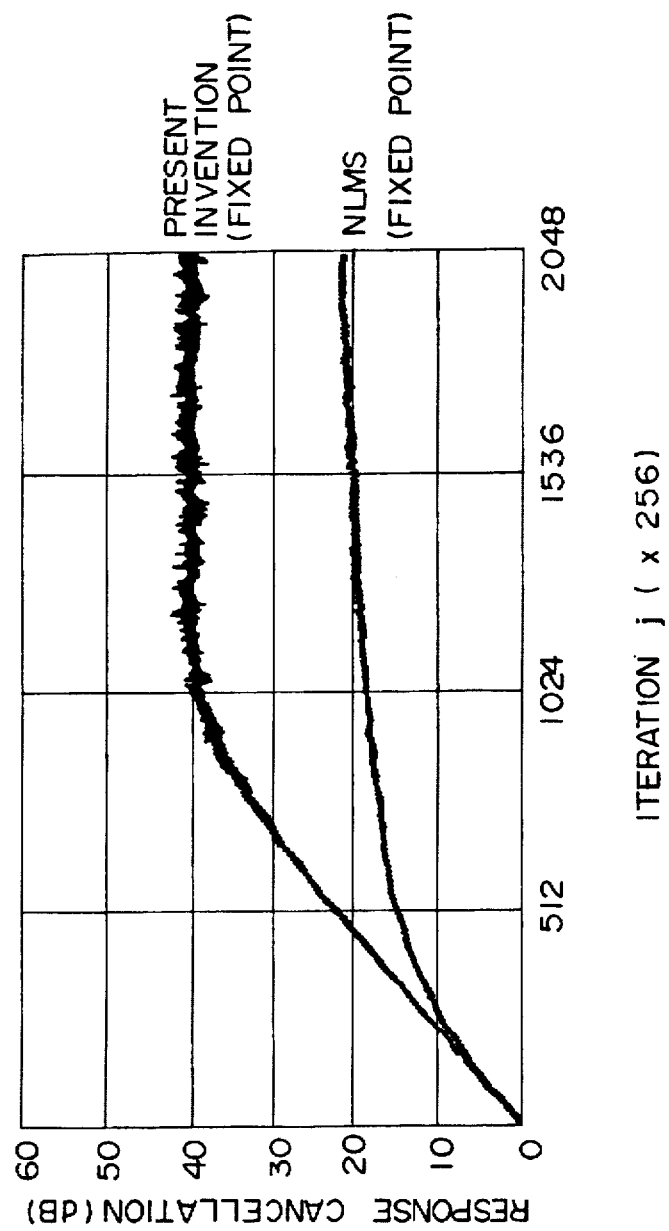
FIG. 24 shows a comparison of convergence properties simulated by the algorithm according to the present invention and the conventional NLMS algorithm, for both of which fixed-point processing is used.

FIG. 24 shows a comparison of convergence properties simulated by the algorithm according to the present invention and the conventional NLMS algorithm, for both of which the fixed-point processing is used. For the calculations by both of the above algorithms, the same 16-bit-word-length fixed-point processing is used. The convergence property by the algorithm according to the present invention is extremely improved as compared to the conventional NLMS algorithm. In comparison with the characteristics shown in FIG. 23, in the algorithm according to the present invention, substantially the same convergence property may be obtained for the fixed-point processing and the floating-point processing.

Therefore, by multiplying the remaining error signal with the sign of the reference signal, the information $[h(m)-H_j(m)]$ required for the coefficient adjustment may be derived in the same word length as that of the reference. In the algorithm according to the present invention, the information $[h(m)-H_j(m)]$ is separated and derived. The above operation according to the present invention is different from the conventional sign algorithm in which the reference signal is multiplied with the sign of the remaining error signal.

Further, the principle in which the remaining error signal is multiplied with the sign of the reference signal is applied to the distribution adjusting method mentioned before. The distribution adjusting method is one of methods of calculating the coefficient adjusting amounts by the algorithm according to the present invention shown in an item "A. A first type of apparatus". In the distribution adjusting method, only one coefficient is adjusted for one sample time. In this method, the equations (21) and (22) are rearranged as follows:

$$A_n(m) = \Sigma^{J*} E_j X_j(m) \quad (58)$$

$$P_n(m) = \Sigma^J X_j^2(1) \quad (59)$$

where $\Sigma^{J*}$ is an adding operation for j=nJ+1+(m-1) to (n+1)J+(m-1), and $\Sigma^J$ is an adding operation for j=nJ+1 to (n+1)j. From above equations, the normalized power becomes the same for all coefficients. Further, because of one coefficient adjustment per sample time, the amount of processing may be reduced. The distribution adjusting method is applied by rearranging the equations (58) and (59) to the following equations.

$$A_n(m) = \Sigma^{J*} E_j sgn[X_j(m)] \quad (60)$$

$$P_n(m) = \Sigma^J abs[X_j(1)] \quad (61)$$

Figure 25:
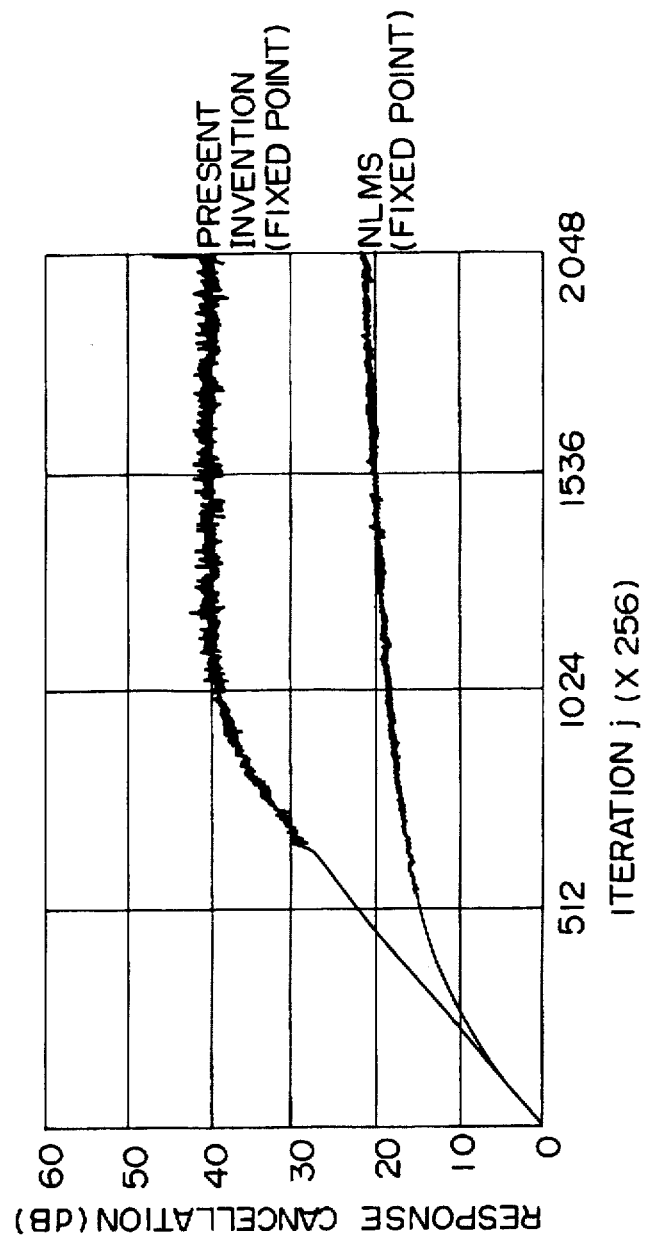
FIG. 25 shows a comparison of convergence properties simulated by the algorithm according to the present invention using the distribution adjusting method and the conventional NLMS algorithm, for both of which the fixed-point processing is used.

FIG. 25 shows a comparison of convergence properties simulated by the algorithm according to the present invention using the distribution adjusting method and the conventional NLMS algorithm, for both of which the fixed-point processing is used. For the calculations by both of the above algorithms, the same 16-bit-word-length fixed-point processing is used. In FIG. 25, the same convergence properties as those of FIG. 24 are obtained.

Further, in the case where the fixed-point processor is used and the processing time is reduced by widely using the fixed-point processing, the present invention may be applied to a variety of adaptive algorithms.

[2] Application to the NLMS algorithm

For the application to the NLMS algorithm, the equation (17) indicating the coefficient adjustment is rewritten as follows:

$$H_{j+1}(m) = H_j(m) + KE_j sgn[X_j(m)]/\Sigma abs[X_j(i)] \quad (62)$$

And, the above equation is rearranged as follows:

$$H_{j+1}(m) = H_j(m) + K[\Sigma \delta_j(i) X_j(i) + N_j] sgn[X_j(m)]/\Sigma abs[X_j(i)] \quad (63)$$

$$= H_j(m) + K[\delta_j(m) X_j(m) + \Sigma_m \delta_j(i) X_j(i) +$$

$$N_j] sgn[X_j(m)]/\Sigma abs[X_j(i)]$$

$$= H_j(m) + [h_j(m) - H_j(m)] K abs[X_j(m)]/abs[X_j(i)] +$$

$$K[\Sigma_m \delta_j(i) X_j(i) + N_j] sgn[X_j(m)]/\Sigma abs[X_j(i)]$$

In this way, the information $[h_j(m)-H_j(m)]$ required for the coefficient adjustment may be derived. Namely, in the method in which the algorithm multiplying the remaining error signal with the sign of the reference signal is normalized by the absolute value of the reference signal, the coefficient of the FIR filter may be separated and derived in the same way as the conventional NLMS algorithm. The above operation is different from the sign algorithm.

Figure 5:
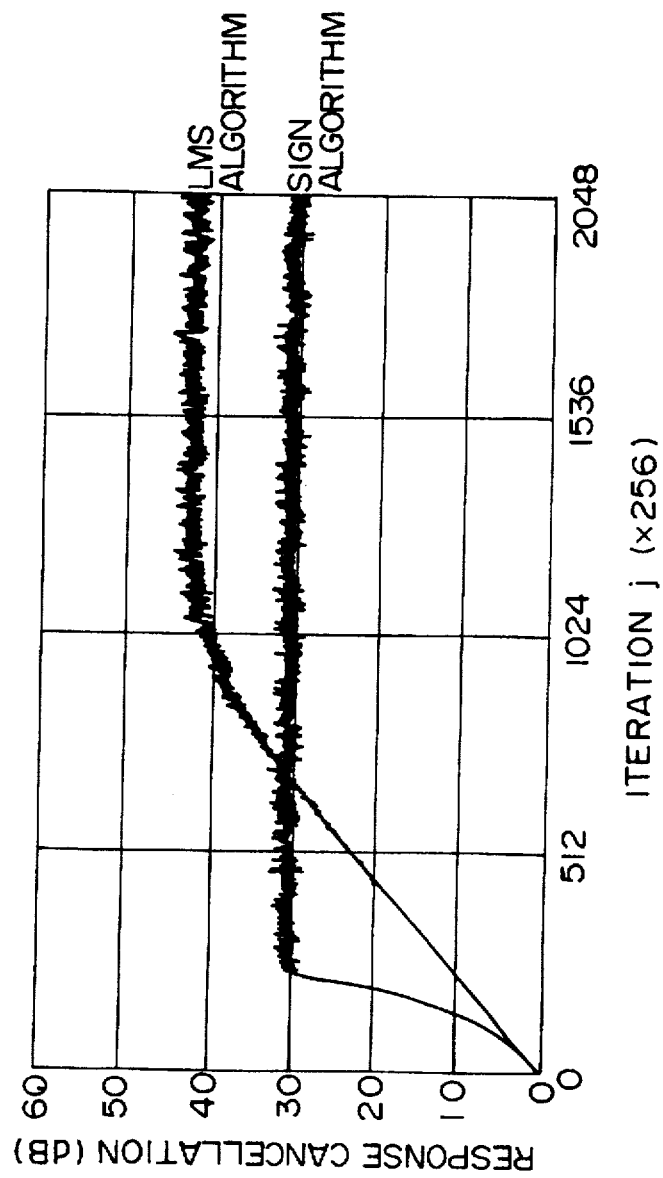
FIG. 5 shows characteristics of response cancellation in a sign algorithm when a step gain K is 0.000263.
Figure 6:
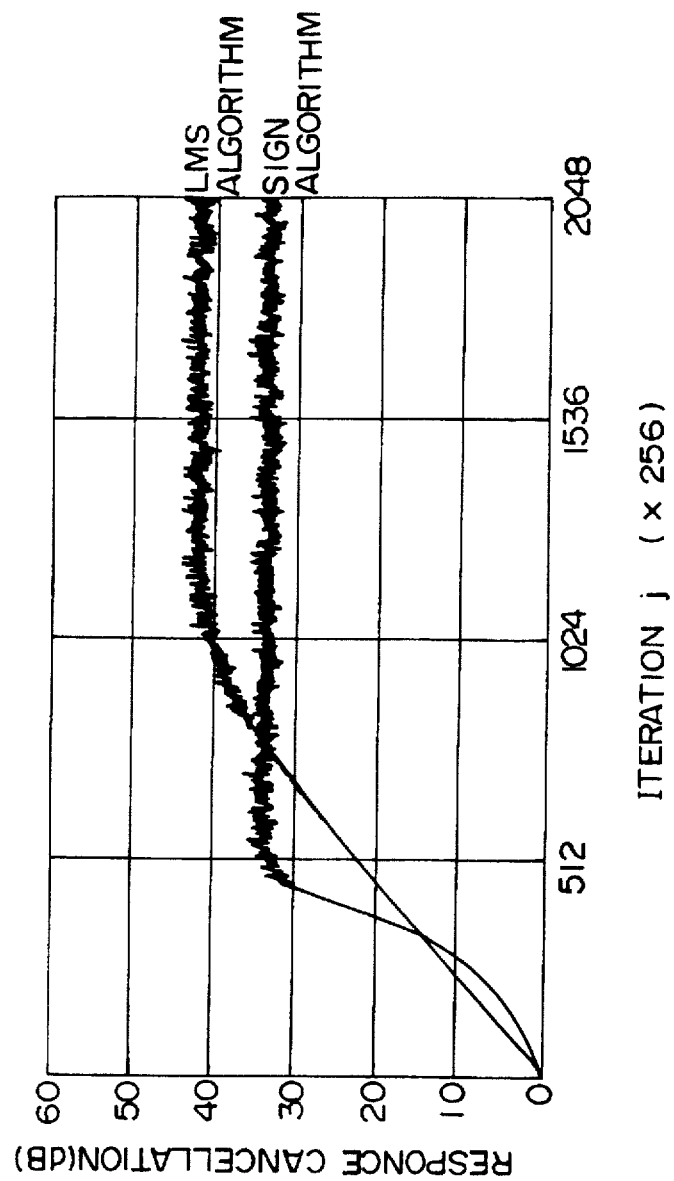
FIG. 6 shows characteristics of response cancellation in the sign algorithm when the step gain K is 0.000132.
Figure 26:
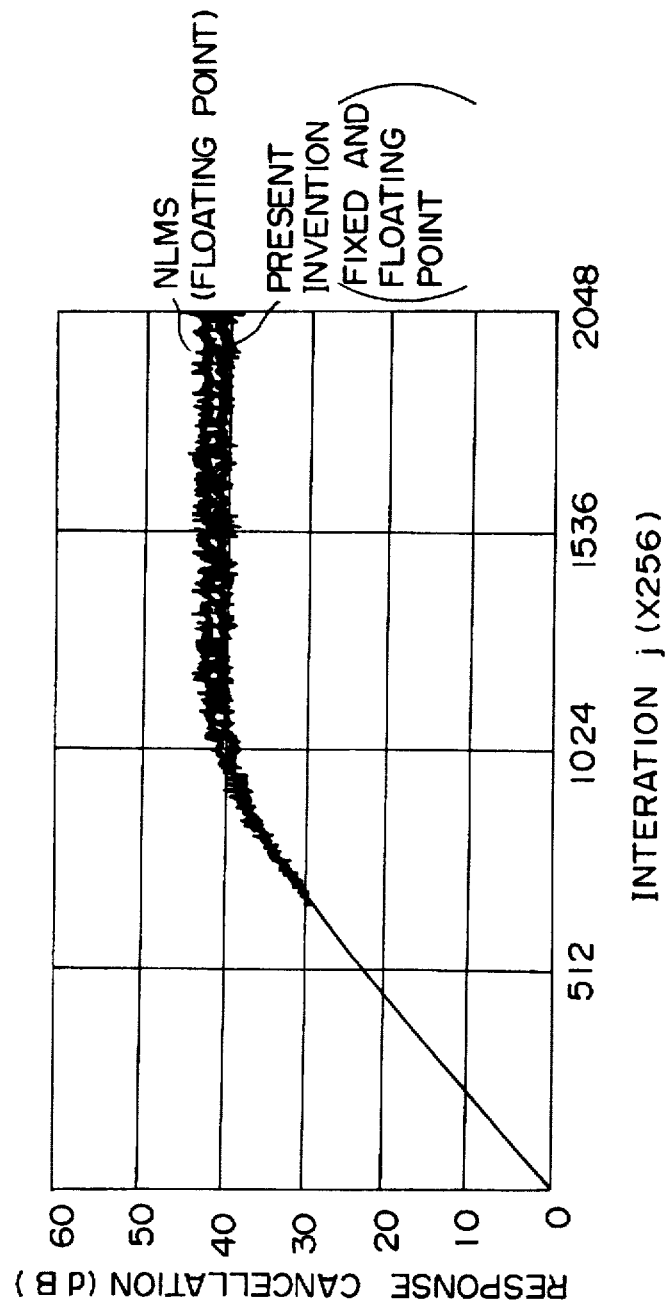
FIG. 26 shows a comparison of convergence properties simulated by the algorithm according to the present invention with the fixed-point processing and the floating-point processing and the conventional NLMS algorithm with the floating-point processing.

FIG. 26 shows a comparison of convergence properties simulated by the algorithm according to the present invention with the fixed-point processing and the floating-point processing and the conventional NLMS algorithm with the floating-point processing. In the algorithm according to the present invention, the numerator and the denominator of the second term in the equation (62) are respectively calculated with the fixed-point processing, and the quotient is obtained with the floating-point processing. After that, the quotient is added to the first term of the equation (62). The convergence property according to the present invention may be improved as compared to the convergence properties simulated by the sign algorithm shown in FIG. 5 and FIG. 6.

[3] Application to an adding normalization LMS algorithm

The adding normalization LMS algorithm is represented by the following equation.

$$H_{j+1}(m) = H_j(m) + K\Sigma^J E_j X_j(m)/\Sigma^J \Sigma X_j^2(i) \quad (64)$$

The present invention is applied to the adding normalization LMS algorithm as follows:

$$H_{j+1}(m) = H_j(m) + K\Sigma^J E_j sgn[X_j(m)]/\Sigma^J \Sigma abs[X_j^2(i)] \quad (65)$$

The information $[h(m)-H_j(m)]$ required for the coefficient adjustment may be derived from the second term in the above equation in the same way as the NLMS algorithm. An advantage of the above algorithm is that the step gain K may be increased in proportion to the number of adding processes to the same convergence property. When the step gain K is larger, all processes including the calculation after the normalization may be carried out with the fixed-point processing.

Figure 27:
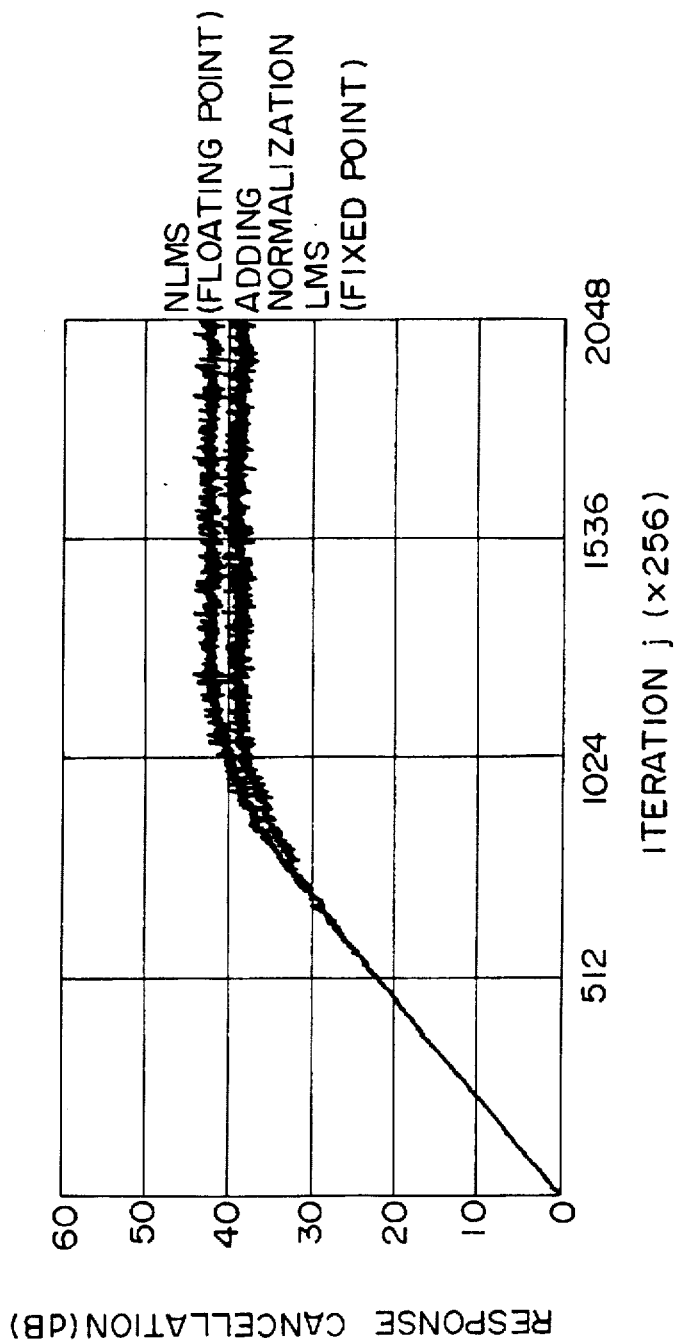
FIG. 27 shows a comparison of convergence properties simulated by the adding normalization LMS algorithm according to the present invention with the fixed-point processing and the conventional NLMS algorithm with the floating-point processing.

FIG. 27 shows a comparison of convergence properties simulated by the adding normalization LMS algorithm according to the present invention with the fixed-point processing and the conventional NLMS algorithm with the floating-point processing. In the calculation, the number J of adding processes is 32, the step gain K is 0.32. As shown in FIG. 27, by applying the present invention to the adding normalization LMS algorithm, the convergence property may be improved for the usage of the fixed-point processing.

Figure 28:
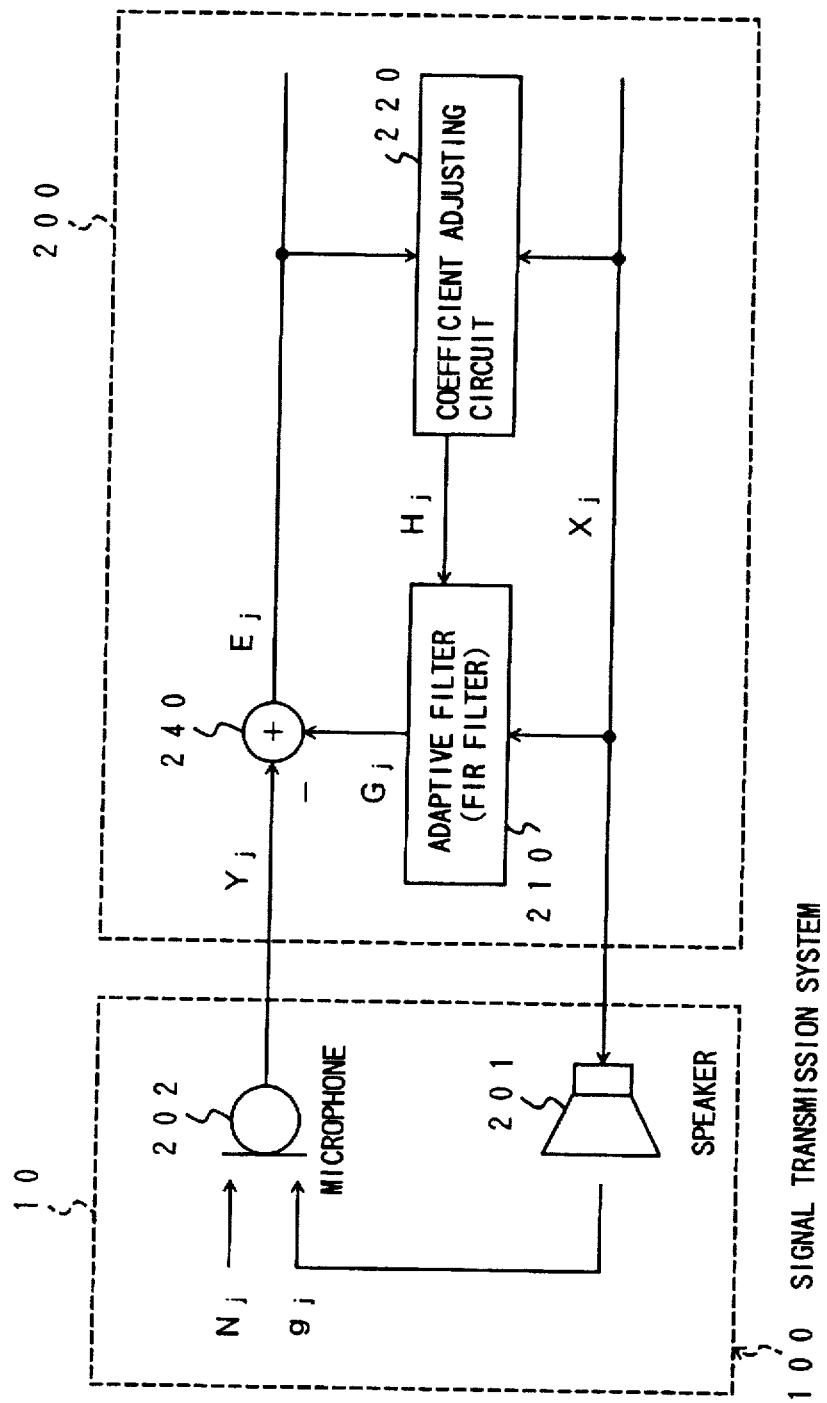
FIG. 28 shows a circuit configuration of hands-free communication equipment.

The above-mentioned coefficient adjusting algorithm is suitable for the system in which the remaining error $E_j$ is detected as an electrical signal such as an acoustic echo canceller shown in FIG. 28. FIG. 28 shows a circuit configuration of hands-free communication equipment.

In the hands-free communication equipment, an acoustic echo canceller 200 is provided to reduce acoustic coupling between a speaker 201 and a microphone 202. The hands-free communication equipment comprises the acoustic echo canceller 200 and a signal transmission system 100. The signal transmission system 100 includes the speaker 201 producing a far-end talker's voice and the microphone 202 provided with a near-end talker's voice. The acoustic echo canceller 200 comprises an adaptive filter 210 simulating the characteristics of the signal transmission system 100, a subtracter 240 cancelling the echo in a signal provided to the microphone 202, and a coefficient adjusting circuit 220 adjusting the coefficients of the adaptive filter.

In the hands-free communication equipment shown in FIG. 28, by the far-end talker's signal $X_j$ provided to the signal transmission system 100 including the speaker 201, the echo occurs as represented in the following equation.

$$g_j = \Sigma h_j(i) X_j(i) \quad (66)$$

The echo enters the microphone 202. In the acoustic echo canceller 200, echo replica $G_j$ is synthesized in the adaptive filter 210 (for example, FIR filter).

$$G_j = \Sigma H_j(i) X_j(i) \quad (67)$$

And, in the subtracter 240, the echo $g_j$ is cancelled by subtracting the echo replica $G_j$ from a signal $Y_j$ produced from the microphone 202. In the above operation, it is assumed that the number of taps of the adaptive filter is the same as the maximum delay I of the echo.

A degree of the echo cancellation is represented by a difference $\delta_j(i)$ between the coefficient $H_j(i)$ of the adaptive filter simulated in the coefficient adjusting circuit 220 and an impulse response $h_j(i)$ defining the characteristics of the signal transmission system 100.

$$\delta_j(i) = h_j(i) - H_j(i) \quad (68)$$

Effect of the acoustic echo canceller becomes maximum when the remaining error $E_j$ represented by the following equation is minimum.

$$E_j = \Sigma \delta_j(i) X_j(i) + N_j \quad (69)$$

where $N_j$ is outside noise.

In the example of the circuit configuration shown in FIG. 28, the coefficient adjusting circuit 220 corresponds to the apparatus for estimating filter coefficients according to the present invention. The coefficient adjusting circuit 220 adjusts the filter coefficient $H_j(i)$ of the adaptive filter 210 so as to minimize the remaining echo $E_j$. In this way, the filter having the impulse response indicating the characteristic of the signal transmission system 100 is constructed.

Figure 29:
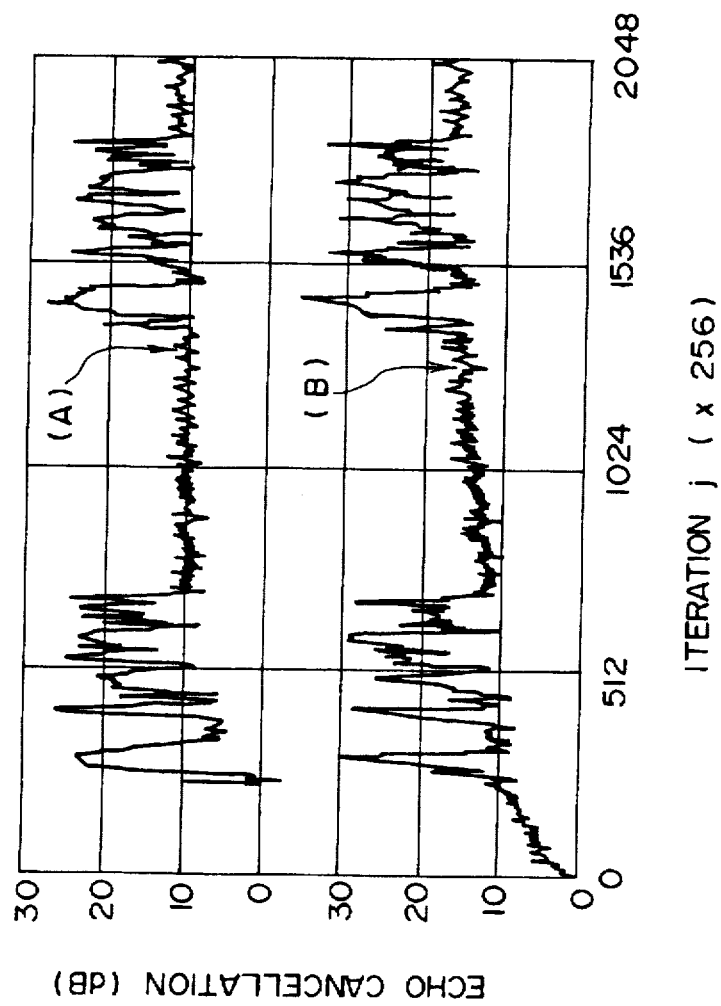
FIG. 29 shows a comparison of convergence properties simulated by the algorithm according to the present invention using the distribution adjusting method (B) and the conventional NLMS algorithm (A) in an acoustic echo canceller.

FIG. 29 shows a comparison of convergence properties simulated by the algorithm according to the present invention using the distribution adjusting method (B) and the conventional NLMS algorithm (A) in the acoustic echo canceller. In FIG. 29, the convergence properties are calculated with practical voice. A graph (A) indicates the convergence property in the case of the conventional NLMS algorithm, and a graph (B) indicates the convergence property in the case where the present invention is applied to the distribution adjusting method. In the above simulation, the step gain K is given by $1/128$ in the present invention. In the conventional NLMS algorithm, permissible amplitude width of the voice strength is strongly restricted (when the power of the reference signal is less than the value required for the given estimation precision, the coefficient adjustment is stopped), and the step gain is given by a large value $1/4$. By applying the present invention to the distribution adjusting method, the convergence property in the coefficient adjusting algorithm may be improved.

Figure 30:
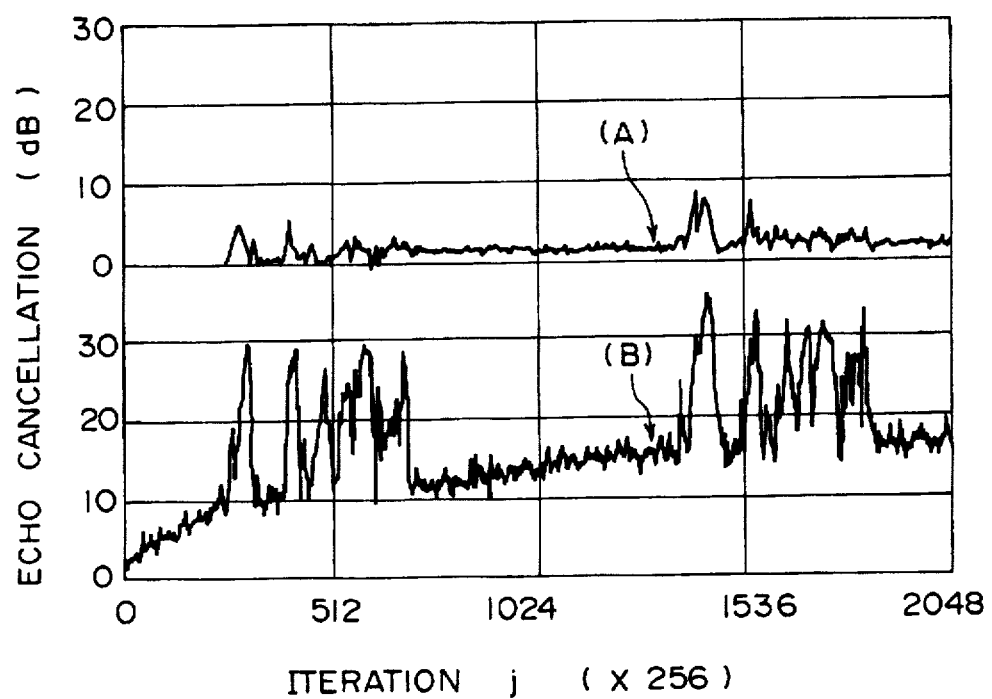
FIG. 30 shows a comparison of convergence properties in a case where the present invention is applied to the adding normalization LMS algorithm (B) and the NLMS algorithm (A) in the acoustic echo canceller.

FIG. 30 shows a comparison of convergence properties in a case where the present invention is applied to the adding normalization LMS algorithm (B) and the NLMS algorithm (A) in the acoustic echo canceller. In FIG. 30, the convergence properties are calculated in a case where the lower limit of the permissible amplitude width of the voice strength is assumed to be the outside noise level in the far end side. In FIG. 30, a graph (A) indicates the convergence property in the case where the present invention is applied to the conventional NLMS algorithm, and a graph (B) indicates the convergence property in the case where the present invention is applied to the adding normalization LMS algorithm. In the above simulation, it is assumed that the outside noise levels of the near-end side and the far-end side are the same as each other. And, the power ratio of the voice to the outside noise is assumed to be 20 dB, and the echo cancellation required for the stable operation is assumed to be 20 dB. Further, in the calculation, the step gain K is given by $1/128$, and the number J of adding processes is 128. As shown in FIG. 30, the convergence property in the case where the present invention is applied to the adding normalization LMS algorithm is improved, and, thus, wide variation of the voice strength may be permitted by applying the present invention.

[4] Application to a system having an error path

Figure 31:
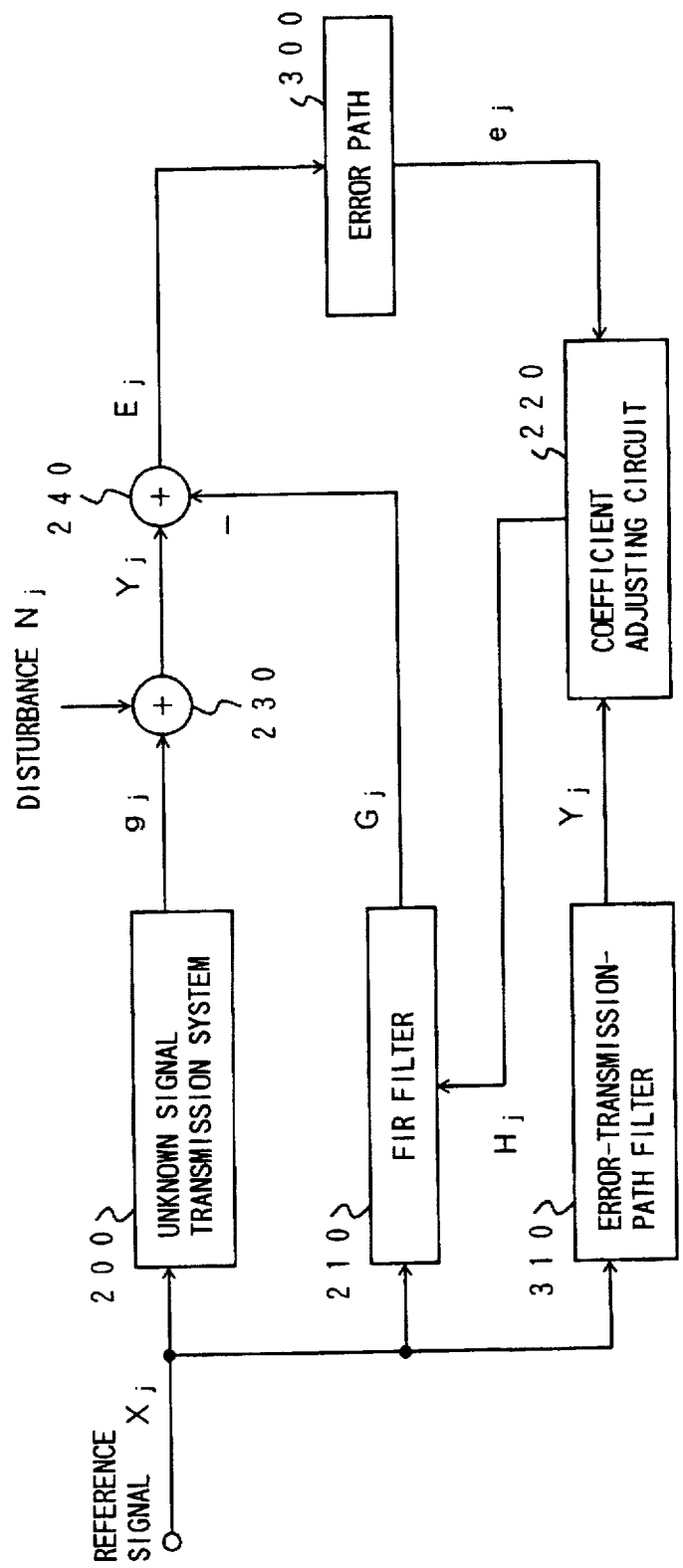
FIG. 31 shows a block diagram of a system for estimating characteristics of a signal transmission system, in which a remaining error $E_j$ is detected through an error transmission path.
Figure 32:
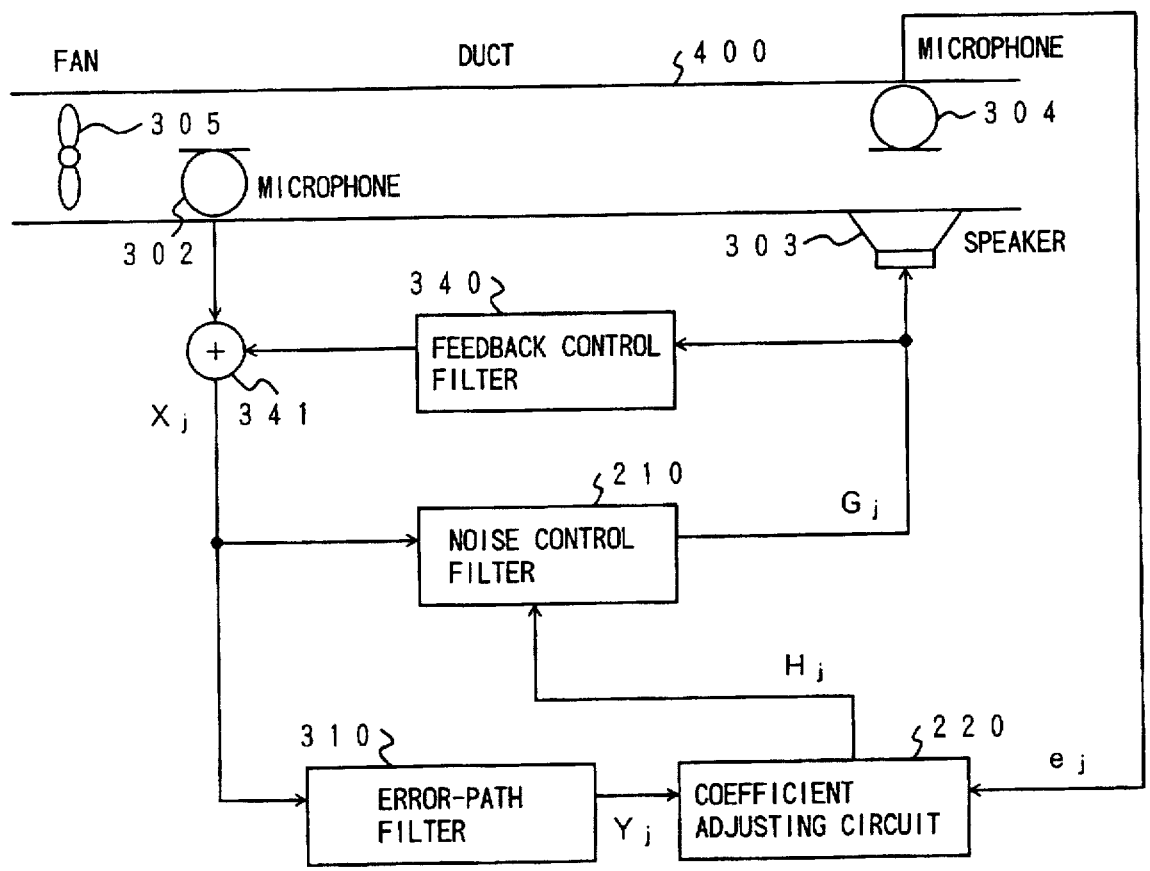
FIG. 32 shows a block diagram of an active noise control system.

FIG. 31 shows a block diagram of a system for estimating characteristics of an unknown signal transmission system, in which a remaining error $E_j$ is detected through the error path. In the system for estimating the characteristics of the unknown signal transmission system 200, the remaining error $E_j$ is provided to the coefficient adjusting circuit 220 through an error path 300. And, the reference signal $X_j$ is provided to the coefficient adjusting circuit 220 through an error-path filter 310. The active noise control device is one example of the system for estimating characteristics shown in FIG. 31. FIG. 32 shows a block diagram of the active noise control system.

In the active noise control device, noise generated in a fan 305 is cancelled in a duct 400. The active noise control device comprises a noise detecting microphone 302 detecting noise, a noise control filter 320 generating a noise replica, a speaker 303 outputting the noise replica, an error detecting microphone 304 detecting a residual noise error, a feedback control filter 340 simulating a feedback system, a coefficient adjusting circuit 220 adjusting coefficients of the noise control filter 210, and an error path filter 310 simulating a path from the noise control filter 210 to the coefficient adjusting circuit 220 through the error detecting microphone 304.

In the active noise control device, the speaker 303 outputs the noise replica which has the same amplitude and the opposite phase as those of noise flowing through the duct 400 at a position of the error detecting microphone 304. The noise flowing through the duct 400 is cancelled by the noise replica at the position of the error detecting microphone 304 to suppress the noise flowing outside of the duct 400. In this description, it is assumed that a part of the noise replica transmitted from the speaker 303 to the noise detecting microphone 302 is completely cancelled by an output of the feedback control filter 340. This path from the speaker 303 to the noise detecting microphone 302 is not directly related to an effect of the present invention.

In the active noise control device, the unknown signal transmission system shown in FIG. 31 corresponds to a noise transmission path from the noise detecting microphone 302 to the error detecting microphone 304. The reference signal provided to the unknown signal transmission system shown in FIG. 31 corresponds to the fan noise $X_j$ detected by the noise detecting microphone 302. The filter simulating the characteristics of the unknown signal transmission system shown in FIG. 31 corresponds to the noise control filter 210. And, the coefficient adjusting circuit 220 corresponds to the apparatus for estimating filter coefficients according to the present invention.

In the active noise control device, the coefficient adjusting circuit 220 adjusts the coefficients $H_j$ of the noise control filter 210 so as to minimize an output $e_j$ of the microphone 304. At this time, the noise radiating from an exit of the duct 400 is minimized.

In this way, when the remaining error signal is detected through only the error path, in the equation for the coefficient adjustment, the reference signal $X_j$ needs to be replaced by the output $Y_j$ of the filter 310 simulating the error path.

[5] Application of the individually normalized LMS (INLMS) algorithm according to the present invention to a system having the error path When the present invention is applied to the system having the error path, the equation (23) of the INLMS algorithm according to the present invention is rearranged by replacing the numerator and the denominator of the second term as follows:

$$A_n(m) = \Sigma^t e_j sgn[Y_j(m)] \quad (70)$$

$$P_n(m) = \Sigma^t abs[Y_j(m)] \quad (71)$$

For example, on the assumption that an impulse response of the error path 300 is given by a(t) (where t=1 to T), and the error path 300 is completely simulated by the error-path filter 310, the following equations are defined.

$$e_j = {}_1\Sigma^T a(t) E_{j-t} \quad (72)$$

where ${}_1\Sigma^T$ is an adding operation for t=1 to T.

$$Y_j = {}_1\Sigma^T a(t) X_{j-t} \quad (73)$$

Then, the remaining error $E_j$ is separated to the one component related to a tap m and the other component as follows:

$$e_j = {}_1\Sigma^T a(t)[h(m) - H_{j-t}(m)] H_{j-t}(m) + {}_1\Sigma^T a(t) \Sigma_m [h(i) - H_{j-t}(i)] X_{j-t}(i) \quad (74)$$

On the other hand, since the coefficient adjusting amounts per one adjustment are small in a practical operation, the coefficient of the FIR filter in an n'th period may be approximated as follows:

$$H_{j-t}(m) \approx H_n(m) \quad (75)$$

In this case, the above equation (74) is rearranged by the equation (73) as follows:

$$e_j = [h(m) - H_n(m)]_1 \Sigma^T a(t) X_{j-t}(m) + {}_1\Sigma^T a(t) \Sigma_m [h(i) - H_{j-t}(i)] X_{j-t}(i) \quad (76)$$

Therefore, a product of $e_j$ and $sgn[Y_j(m)]$ is represented by the following equation.

$$e_j sgn[Y_j(m)] = [h(m) - H_n(m)] abs[Y_j(m)] + \quad (77)$$

$${}_1\Sigma^T a(t) \Sigma_m [h(i) - H_{j-t}(i)] X_{j-t}(i) sgn[Y_j(m)]$$

In this way, by the normalization by the equation (71), the information $[h_j(m)-H_j(m)]$ required for the coefficient adjustment may be generated. The above operation suggests that the present invention may be positively applied to the system having the error path.

Figure 33:
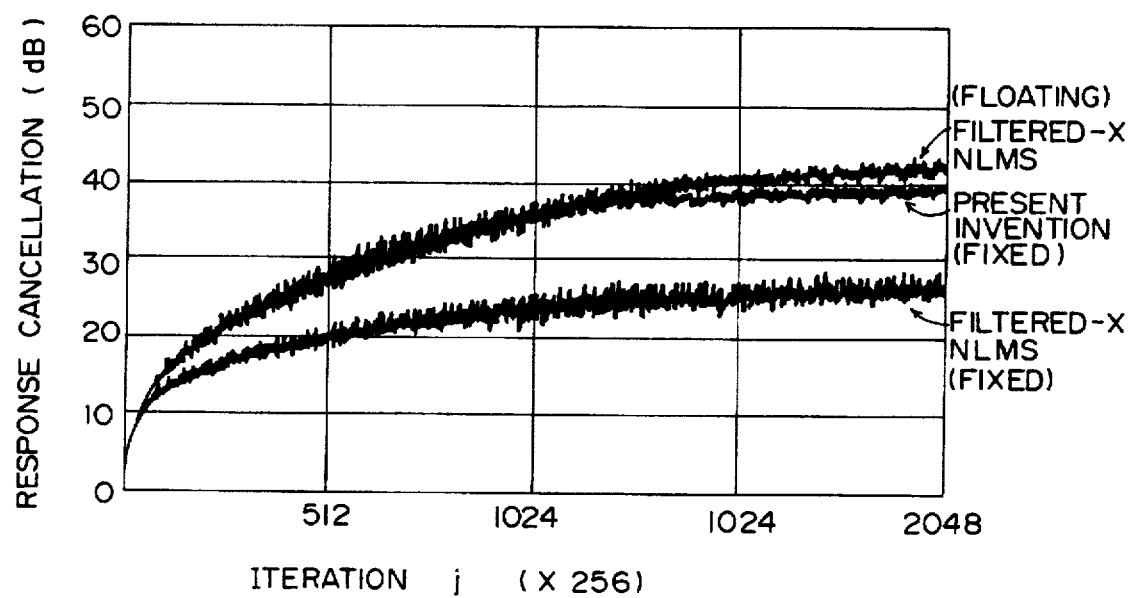
FIG. 33 shows a comparison of convergence properties simulated by the filtered-X NLMS algorithm with the fixed-point processing and the floating-point processing and the INLMS algorithm according to the present invention with the fixed-point processing in the system in which the remaining error is transmitted through the error transmission path.

FIG. 33 shows a comparison of convergence properties simulated by the filtered-X NLMS algorithm with the fixed-point processing and the floating-point processing and the INLMS algorithm according to the present invention with the fixed-point processing in the system in which the remaining error is transmitted through the error path. The convergence property by the INLMS algorithm according to the present invention is simulated by using the equations (70) and (71). The initial convergence speed by the INLMS algorithm according to the present invention with the fixed-point processing is slightly faster than that of the filtered-X NLMS algorithm with the floating-point processing. The converged response cancellation by the present invention is degraded a little as compared to the filtered-X NLMS algorithm with the floating-point processing. However, the converged response cancellation by the present invention is extremely improved as compared to the filtered-X NLMS algorithm with the fixed-point processing.

[6] Application of the distribution adjusting method to the system having the error path In the same way, the distribution adjusting method of the INLMS algorithm according to the present invention is applied to the system in which the remaining error is transmitted through the error path. This application is carried out by replacing the equations (21) and (22) by the following equations.

$$A_n(m) = \Sigma^{j*} E_j sgn[Y_j(m)] \tag{78}$$

$$P_n(m) = \Sigma^j abs[Y_j(1)] \tag{79}$$

[7] Application of the NLMS algorithm to the system having the error path

The NLMS algorithm is applied to the system having the error path by replacing the equation (23) by the following equation.

$$H_{n+1}(m) = H_n(m) + KE_j sgn[Y_j(m)]/\Sigma abs[Y_j(i)] \tag{80}$$

[8] Application of the LMS algorithm to the system having the error path

The LMS algorithm is applied to the system having the error path by replacing the equation (23) by the following equation.

$$H_{n+1}(m) = H_n(m) + K E_j sgn[Y_j(m)] \tag{81}$$

[9] Application of the adding normalization LMS algorithm to the system having the error path The adding normalization LMS algorithm is applied to the system having the error path by replacing the equation (23) by the following equation.

$$H_{n+1}(m) = H_n(m) + K\Sigma^j E_j sgn[Y_j(m)]/\Sigma^j \Sigma abs[Y_j(i)] \tag{82}$$

Figure 34:
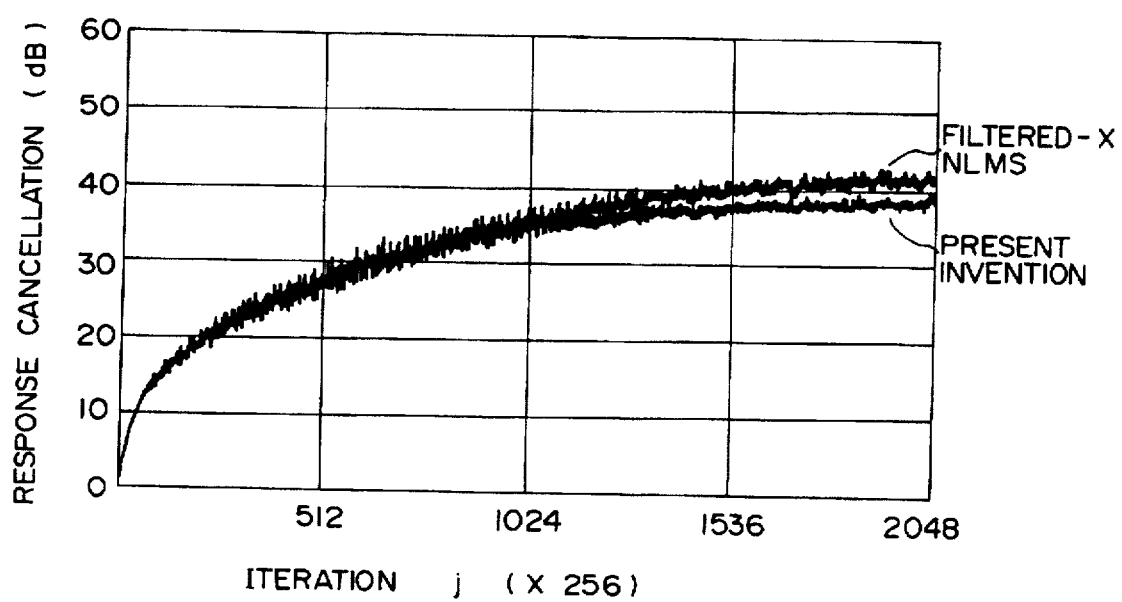
FIG. 34 shows a comparison of convergence properties simulated by the filtered-X NLMS algorithm and the adding normalization LMS algorithm according to the present invention in the system in which the remaining error is transmitted through the error transmission path.

FIG. 34 shows a comparison of convergence properties simulated by the filtered-X NLMS algorithm and the adding normalization LMS algorithm according to the present invention in the system in which the remaining error is transmitted through the error path. FIG. 34 suggests that the present invention may be applied to the system in which the remaining error is transmitted through the error path. For the adding normalization LMS algorithm, even if the algorithm is wholly calculated with the fixed-point processing, the calculated convergence property is degraded only a little as compared to the Filtered-X NLMS algorithm with the floating-point processing. The same effect is also present in the above-mentioned applications [6] to [8].

[10] A method of suppressing the integration value within the restricted word length In the NLMS algorithm, the addition of the absolute value of the reference signal is further carried out, and in the adding normalization LMS algorithm, the addition of the product of the remaining error signal and the sign of the reference signal is further carried out. Those additions increase the integration value, whereby the integration value is increased larger than the word length restricted by the fixed-point processing. At this time, the integration value may not be a true value. Therefore, when the coefficient is adjusted by using that integration value, an error occurs. A simple method of preventing the error operation is that the reference signal or the product to be added is multiplied with a small constant value to prevent the overflow. However, that multiplication is equivalent to omitting the lower bits, and degrades the advantages of the present invention by the restricted usage of the word length.

To prevent the degradation due to the omission of the lower bits, the following method is considered. When a fact that the addition causes the overflow is detected by checking the adding process, a small constant value is repeatedly added to the integration value and an addition input. For example, by further providing the following processes, the word length may be effectively utilized.

i) First, on the assumption that the absolute value of the reference signal $X_j$ is adjusted to less than 0.5, the integration value $S_j$ is calculated on the constant value $M=1.0$ as an initial value.

$$S_x = S_x + abs[X_j]M \tag{83}$$

ii) When $S_j \leq 0.5$, at the next time addition, the overflow may be caused. Therefore, the process is separated into two processes as follows.

iii) When $S_j \leq 0.5$, the following equations are defined to prevent the overflow.

$$S_x = 0.5S \tag{84}$$

$$M = 0.5M \tag{85}$$

The adjustment of the constant value M has a feature that the level of the absolute value of the reference signal $X_j$ which has been added is adjusted to the level of the absolute value of the same signal to be added.

Further, the present invention is not limited to these embodiments, but other variations and modifications may be made without departing from the scope of the present invention.

What is claimed is:

1. An apparatus for estimating filter coefficients in a system which includes a filter simulating characteristics of an unknown signal transmission system based on a signal provided to the unknown signal transmission system and a response signal produced from the unknown signal transmission system, the apparatus comprising:

accumulation calculating means for accumulating a product of the signal provided to said unknown signal transmission system and a difference between the response signal from the unknown signal transmission system and an output signal of said filter for a given time period;

square-sum calculating means for accumulating a square of the signal provided to the unknown signal transmission system for the given time period; and adjusting-amounts simulating means for simulating coefficient adjusting amounts of said filter based on a ratio of an output of said accumulation calculating means to an output of said square-sum calculating means;

wherein coefficients of said filter are adjusted by using said coefficient adjusting amounts simulated in said adjusting-amounts simulating means.

2. The apparatus as claimed in claim 1, wherein said square-sum calculating means calculates the square of the signal provided to the unknown signal transmission system and comprises a shift register for successively storing the square of the signal provided to the unknown signal transmission system, said square-sum calculating means accumulating an output of each tap of said shift register to obtain an accumulation of the square of the signal, the accumulation being used for simulating the coefficient of each tap of said filter.

3. The apparatus as claimed in claim 1, wherein said coefficient of said filter are adjusted by means for adjusting the coefficient of each tap of said filter at an interval of a given number of sample times.

4. The apparatus as claimed in claim 3, wherein said square-sum calculating means calculates the square of the signal provided to the unknown signal transmission system and comprises a register for storing an accumulation value of said square of the signal for a time period based on a number of taps of said filter, and the coefficient of each tap of the filter is adjusted based on a content of said register.

5. The apparatus as claimed in claim 4, wherein said register stores a reciprocal of said accumulation value of the square of the signal provided to the unknown signal transmission system.

6. The apparatus as claimed in claim 1, wherein said given time period is a time period until an accumulation value of the square of the signal provided to the unknown signal transmission system reaches a predetermined value.

7. The apparatus as claimed in claim 1, wherein the accumulation of said square-sum calculating means is performed by a number of adding processes having a lower limit which is determined by a product of a step gain and a number of taps of said filter.

8. The apparatus as claimed in claim 7, wherein said apparatus further comprises:

a shift register storing a value related to an accumulation value of the square of the signal provided to the unknown signal transmission system calculated by the square-sum calculating means; and means for writing adjustment impermissible information to said shift register when said accumulation value of the square calculated by the square-sum calculating means does not reach a given reference value, and for writing a value related to said accumulation value of the square when the said accumulation value of the square reaches the given reference value;

wherein the coefficient of each tap of said filter is adjusted when an output of each tap of said shift register is related to said accumulation value of the square, and the coefficient of each tap of said filter is not adjusted when the output of each tap of said shift register is related to said adjustment impermissible information.

9. The apparatus as claimed in claim 1, wherein said apparatus further comprises:

means for defining a step gain so that a ratio of a maximum value of a product of said square of the signal provided to the unknown signal transmission system and the number I of taps of said filter to a product of the accumulation value of the square of the signal by which an estimation error is within a given value and the step gain could be an integer; and a register storing said accumulation value of the square of the signal provided to the unknown signal transmission system;

wherein a content of said register is adjusted every I sample times according to the number I of taps of the filter only when the accumulation value of the square of the signal provided to the unknown signal transmission system reaches to or exceeds said maximum value.

10. The apparatus as claimed in claim 9, wherein said apparatus further comprises means for setting said accumulation value of the square stored in the register to twice said maximum value.

11. The apparatus as claimed in claim 1, wherein said apparatus further comprises means for detecting an overflow occurring in any of said accumulation calculating means and said square-sum calculating means, wherein when the overflow is predicted and detected, the accumulation values of said accumulation calculating means and said square-sum calculating means are multiplied by ½, and for other additions after that, the accumulation values are respectively multiplied by $½^k$ where k is the number of overflow detection.

12. An apparatus as for estimating filter coefficients in a system which includes a filter simulating characteristics of an unknown signal transmission system based on a signal provided to the unknown signal transmission system and a response signal produced from the unknown signal transmission system, the apparatus comprising:

accumulation calculating means for accumulating a product of the signal provided to said unknown signal transmission system and a difference between the response signal from the unknown signal transmission system and an output signal of said filter for a given time period;

square-sum calculating means for accumulating a square of the signal provided to the unknown signal transmission system for the given time period; and adjusting-amounts simulating means for simulating coefficient adjusting amounts of said filter based on a ratio of an output of said accumulation calculating means to an output of said square-sum calculating means;

wherein coefficients of said filter are adjusted by using said coefficient adjusting amounts simulated in said adjusting-amounts simulating means; and a shift register for storing a flag which is provided when said accumulation value of the square of the signal reaches said predetermined value to indicate a timing for the accumulation in the square-sum calculating means, and from said flag, a timing for adjusting the coefficient of the filter is indicated, and the coefficient of the filter is adjusted by dividing by a predetermined value of the square.

13. The apparatus as claimed in claim 12, wherein said predetermined value of the square comprises a constant value $2^k$.

14. A method of estimating filter coefficients in a system which includes a filter simulating characteristics of an unknown signal transmission system based on a signal provided to the unknown signal transmission system and a response signal produced from the unknown signal transmission system, said method comprising the steps of:

(a) accumulating a product of the signal provided to said unknown signal transmission system and a difference between the response signal from the unknown signal transmission system and an output signal of said filter for a given time period;

(b) accumulating a square of the signal provided to the unknown signal transmission system for the given time period; and (c) simulating coefficient adjusting amounts of said filter based on a ratio of an accumulation result of the step (a) to an accumulation result of the step (b);

(d) adjusting coefficients of said filter by using said coefficient adjusting amounts simulated in the step (c).

15. An apparatus for estimating filter coefficients in a system which includes an adaptive filter simulating characteristics of an unknown signal transmission system based on a reference signal provided to the unknown signal transmission system and a response signal produced from the unknown signal transmission system, said apparatus comprising:

first error information deriving means for deriving information including a difference between an impulse response of said unknown signal transmission system and coefficients of said adaptive filter integrating by a ratio of a result, for a given time period, a product of a difference between the response of the unknown signal transmission system and an output of the adaptive filter and a sign of said reference signal to an integration value of absolute values of the reference signal for the given time period; and first coefficient adjusting means for adjusting the coefficients of the adaptive filter based on said information from the first error information deriving means;

wherein the number of coefficients adjusted for one sample time is restricted, and the number of the integration values of the absolute values of the reference signal used for obtaining said ratio is restricted to less than a number of taps of the adaptive filter.

16. The apparatus as claimed in claim 15, wherein said apparatus further comprises means for multiplying a small constant value with both the integration result and an adding input in said first error information deriving means when the word length of the integration result is over a limited word length so as to adjust the word length of the integration result to within the limited word length.

17. An apparatus for estimating filter coefficients in a system which includes an adaptive filter simulating characteristics of an unknown signal transmission system based on a reference signal provided to the unknown signal transmission system and a response signal produced from the unknown signal transmission system, said apparatus comprising:

second error information deriving means for deriving information related to an error between an impulse response of said unknown signal transmission system and coefficients of said adaptive filter based on a ratio of a product of a difference between the response of the unknown signal transmission system and an output of the adaptive filter and a sign of said reference signal to a sum of absolute values of taps of said adaptive filter; and second coefficient adjusting means for adjusting the coefficients of the adaptive filter based on said information from the second error information deriving means.

18. The apparatus as claimed in claim 17, wherein said apparatus further comprises means for multiplying a small constant value with both the integration result and an adding input in said second error information deriving means when the word length of the integration result is over a limited word length so as to adjust the word length of the integration result to within the limited word length.

19. An apparatus for estimating filter coefficients in a system which includes an adaptive filter simulating characteristics of an unknown signal transmission system based on a reference signal provided to the unknown signal transmission system and a response signal produced from the unknown signal transmission system, said apparatus comprising:

third error information deriving means for deriving information related to an error between an impulse response of said unknown signal transmission system and coefficients of said adaptive filter based on a ratio of a result of integrating, for a given time period, a product of a difference between the response of the unknown signal transmission system and an output of the adaptive filter and a sign of said reference signal to a result of integrating, for the given time period, sums of absolute values of outputs of taps of said adaptive filter; and third coefficient adjusting means for adjusting the coefficients of the adaptive filter based on said information from the third error information deriving means.

20. An apparatus for estimating filter coefficients in a system which includes an adaptive filter simulating characteristics of an unknown signal transmission system based on a reference signal provided to the unknown signal transmission system and a response signal produced from the unknown signal transmission system, and in said system, a difference between a response of the unknown signal transmission system and an output of the adaptive filter is transmitted through a second signal transmission path, a filter simulating a response of the second signal transmission path being provided, wherein a response of said filter is used as a second reference signal, said apparatus comprising:

fourth error information deriving means for deriving information related to an error between an impulse response of said unknown signal transmission system and coefficients of said adaptive filter based on a product of said response of the second signal transmission path and a sign of said second reference signal; and fourth coefficient adjusting means for adjusting the coefficients of the adaptive filter based on said information from the fourth error information deriving means.

21. The apparatus as claimed in claim 20, wherein said apparatus further comprises means for generating coefficient adjusting amounts by multiplying said product with a constant value, and for adjusting the coefficients of the adaptive filter by adding the coefficient adjusting amounts to the coefficients.

22. The apparatus as claimed in claim 20, wherein said apparatus further comprises means for multiplying a small constant value with both the integration result and an adding input in said fourth error information deriving means when the word length of the integration result is over a limited word length so as to adjust the word length of the integration result to within the limited word length.

23. An apparatus for estimating filter coefficients in a system which includes an adaptive filter simulating characteristics of an unknown signal transmission system based on a reference signal provided to the unknown signal transmission system and a response signal produced from the unknown signal transmission system, and in said system, a difference between a response of the unknown signal transmission system and an output of the adaptive filter is transmitted through a second signal transmission path, a filter simulating a response of the second signal transmission path being provided, wherein a response of said filter is used as a second reference signal, said apparatus comprising:

fifth error information deriving means for deriving information related to an error between an impulse response of said unknown signal transmission system and coefficients of said adaptive filter based on a ratio of a result of integrating, for a given time period, a product of said response of the second signal transmission path and a sign of said second reference signal to a result of integrating, for the given time period, absolute values of said second reference signal; and fifth coefficient adjusting means for adjusting the coefficients of the adaptive filter based on said information from the fifth error information deriving means.

24. The apparatus as claimed in claim 23, wherein the number of coefficients adjusted for one sample time is restricted, and the number of integration values of the absolute values of said second reference signal used for obtaining said ratio is restricted to less than a number of taps of the adaptive filter.

25. The apparatus as claimed in claim 23, wherein said apparatus further comprises means for multiplying a small constant value with both the integration result and an adding input in said fifth error information deriving means when the word length of the integration result is over a limited word length so as to adjust the word length of the integration result to within the limited word length.

26. An apparatus for estimating filter coefficients in a system which includes an adaptive filter simulating characteristics of an unknown signal transmission system based on a reference signal provided to the unknown signal transmission system and a response signal produced from the unknown signal transmission system, and in said system, a difference between a response of the unknown signal transmission system and an output of the adaptive filter is transmitted through a second signal transmission path, a filter simulating a response of the second signal transmission path being provided, wherein a response of said filter is used as a second reference signal, said apparatus comprising:

- sixth error information deriving means for deriving information related to an error between an impulse response of said unknown signal transmission system and coefficients of said adaptive filter based on a ratio of a product of said response of the second signal transmission path and a sign of said second reference signal to a sum of absolute values of the second reference signal for taps of said adaptive filter; and
- sixth coefficient adjusting means for adjusting the coefficients of the adaptive filter based on said information from the sixth error information deriving means.

27. An apparatus for estimating filter coefficients in a system which includes an adaptive filter simulating characteristics of an unknown signal transmission system based on a reference signal provided to the unknown signal transmission system and a response signal produced from the unknown signal transmission system, and in said system, a difference between a response of the unknown signal transmission system and an output of the adaptive filter is transmitted through a second signal transmission path, a filter simulating a response of the second signal transmission path being provided, wherein a response of said filter is used as a second reference signal, said apparatus comprising:

- seventh error information deriving means for deriving information related to an error between an impulse response of said unknown signal transmission system and coefficients of said adaptive filter based on a ratio of a result of integrating, for a given time period, a product of said response of the second signal transmission path and a sign of said second reference signal to a result of integrating, for the given time period, sums of absolute values of said second reference signal for taps of said adaptive filter; and
- seventh coefficient adjusting means for adjusting the coefficients of the adaptive filter based on said information from the seventh error information deriving means.

* * * * *